US008285528B1

United States Patent
Szymanski et al.

(10) Patent No.: US 8,285,528 B1
(45) Date of Patent: Oct. 9, 2012

(54) METHOD AND ARTICLE OF MANUFACTURE FOR DETERMINING WARHEAD FRAGMENTATION PERFORMANCE

(75) Inventors: Edwin W. Szymanski, Ridgecrest, CA (US); Robert M. Cox, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 757 days.

(21) Appl. No.: 12/491,019

(22) Filed: Jun. 24, 2009

(51) Int. Cl.
*G06G 7/48* (2006.01)
(52) U.S. Cl. .......................................................... 703/6
(58) Field of Classification Search .................. 703/6, 7; 102/492, 494, 495, 214
See application file for complete search history.

(56) References Cited

U.S. PATENT DOCUMENTS

| 5,696,347 | A | * | 12/1997 | Sebeny et al. | 102/214 |
| 7,451,704 | B1 | * | 11/2008 | Gold et al. | 102/495 |
| 2011/0094408 | A1 | * | 4/2011 | Dupont et al. | 102/492 |
| 2011/0146523 | A1 | * | 6/2011 | Kim et al. | 102/494 |
| 2011/0179966 | A1 | * | 7/2011 | Dupont et al. | 102/492 |

OTHER PUBLICATIONS

Tome, L., "The development of Integrated effectiveness model for aerial targets", Stellenbosch University, Mar. 2007, Part I.*
Tome, L., "The development of Integrated effectiveness model for aerial targets", Stellenbosch University, Mar. 2007, Part II.*
Tome, L., "The development of Integrated effectiveness model for aerial targets", Stellenbosch University, Mar. 2007, Part III.*

* cited by examiner

*Primary Examiner* — Kandasamy Thangavelu
(74) *Attorney, Agent, or Firm* — Christopher L. Blackburn

(57) ABSTRACT

A method and a computer program product for estimating and predicting the performance of fragmentation devices such as, for example, warheads that are often incorporated as part of a weapon system.

3 Claims, 16 Drawing Sheets

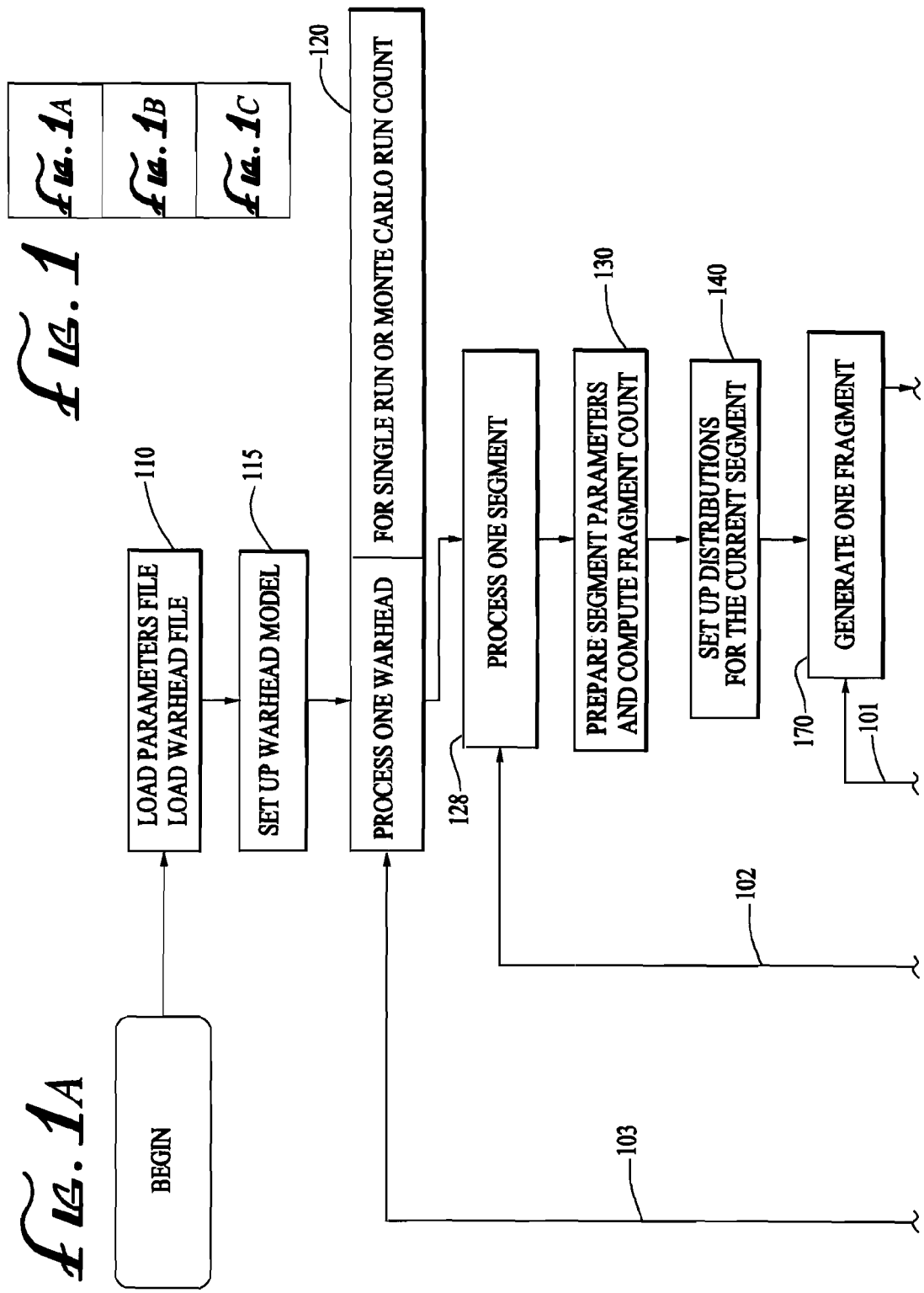

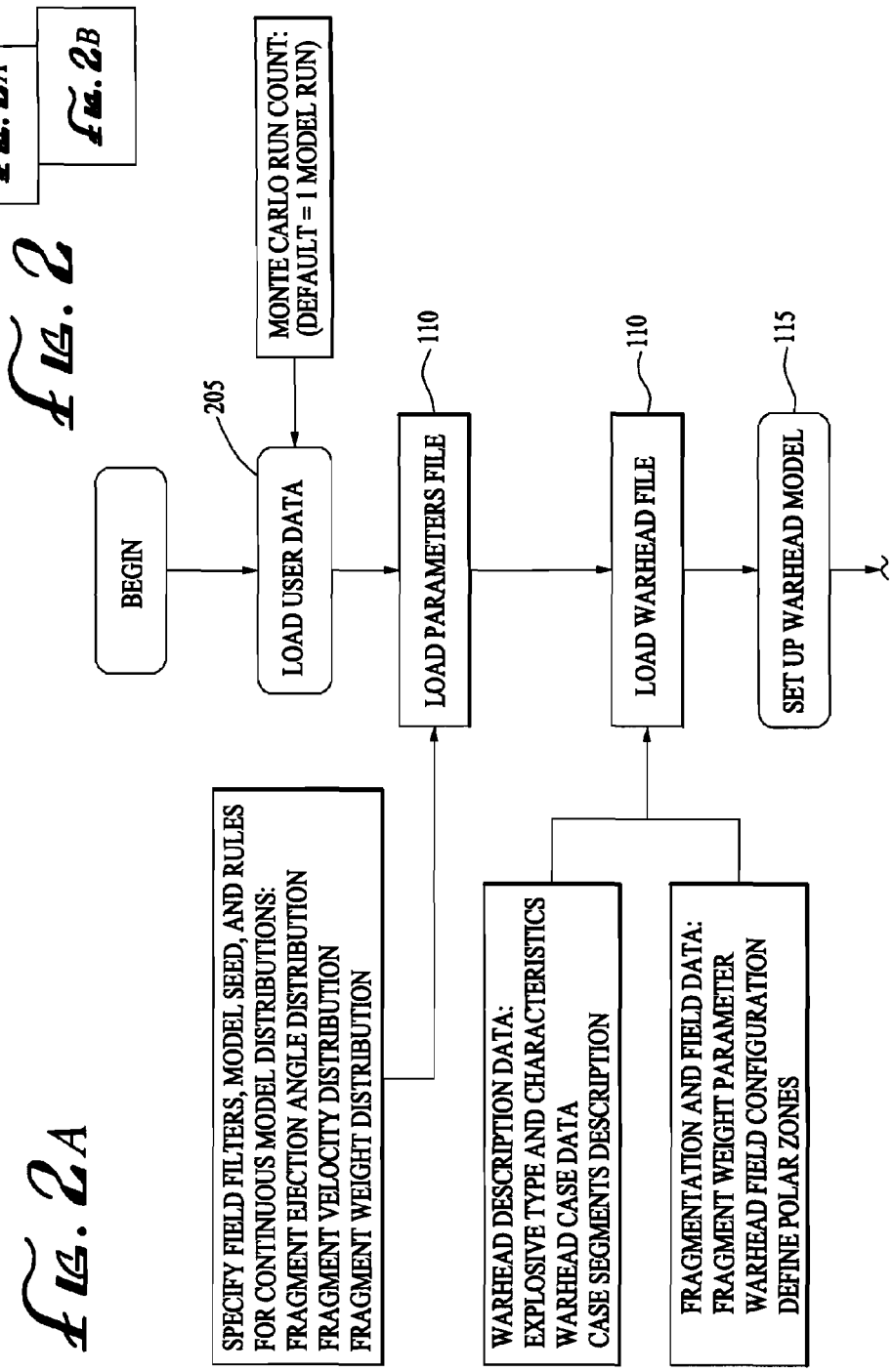

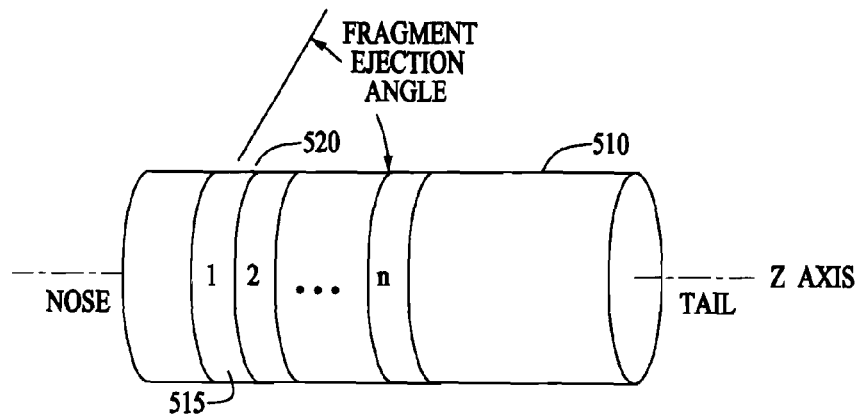
fig. 5A
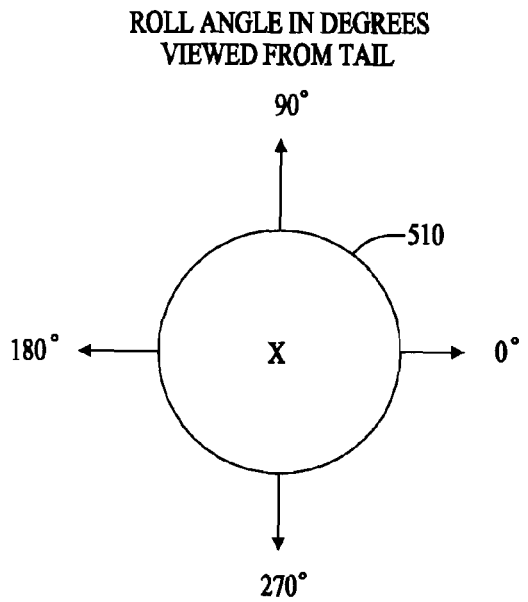
fig. 5B
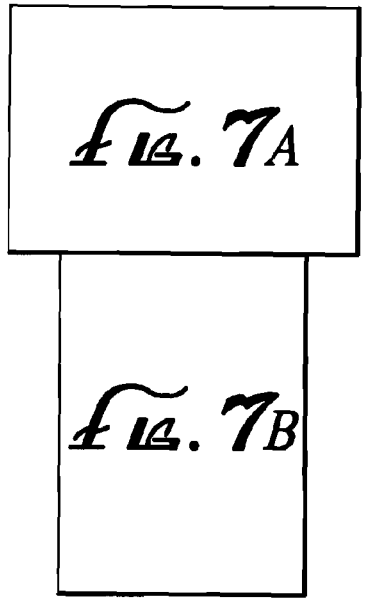
fig. 7A
fig. 7B
fig. 7

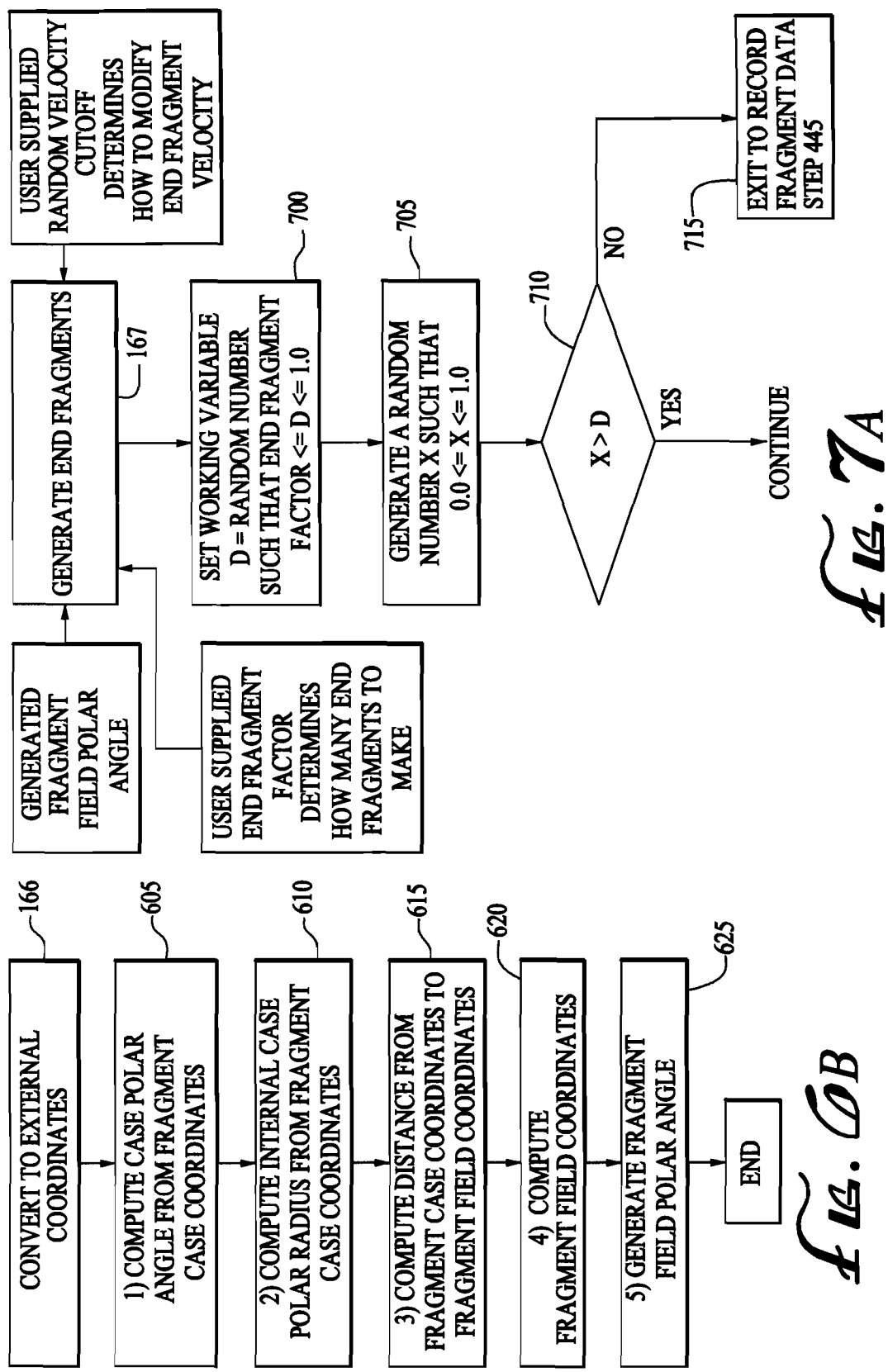

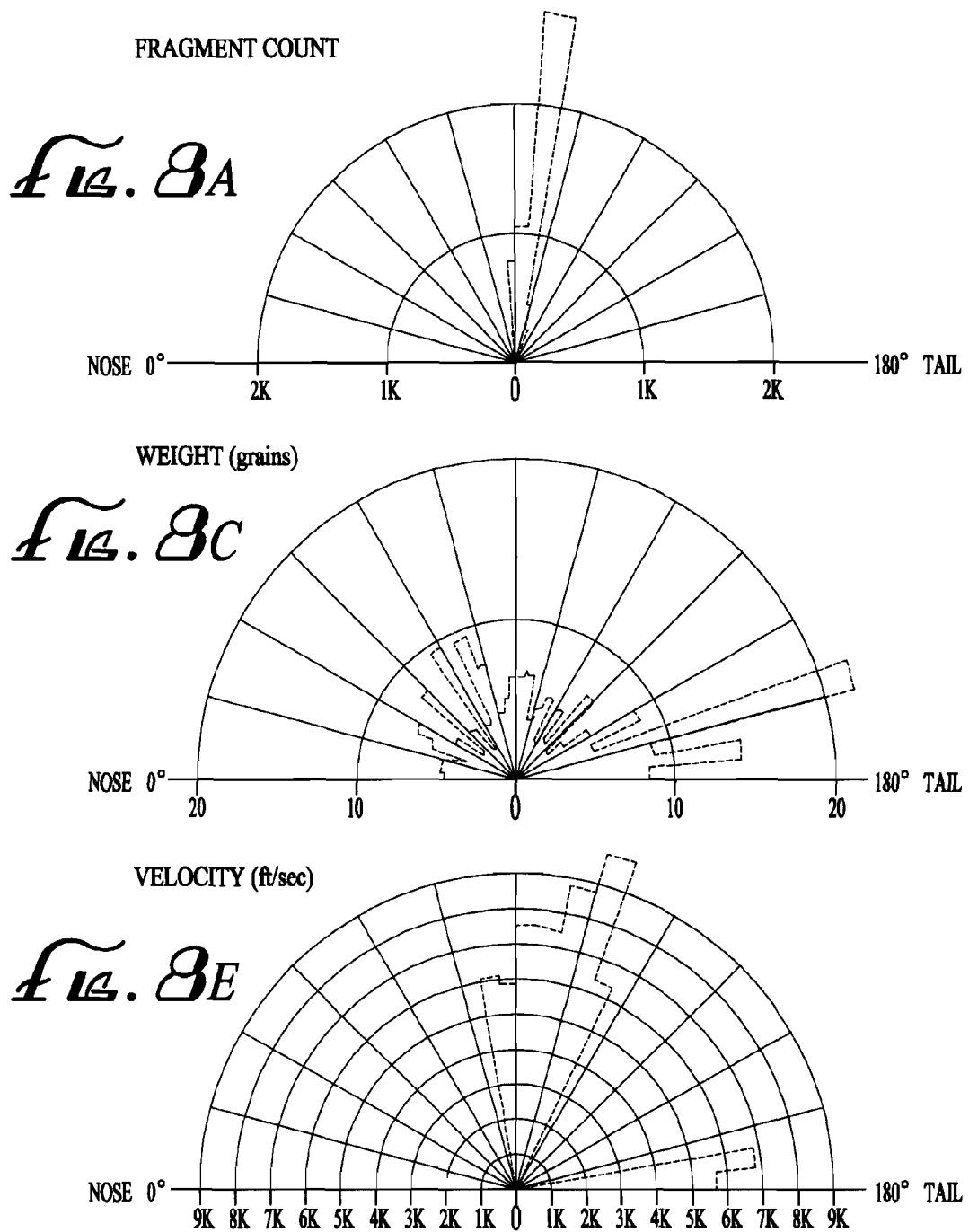

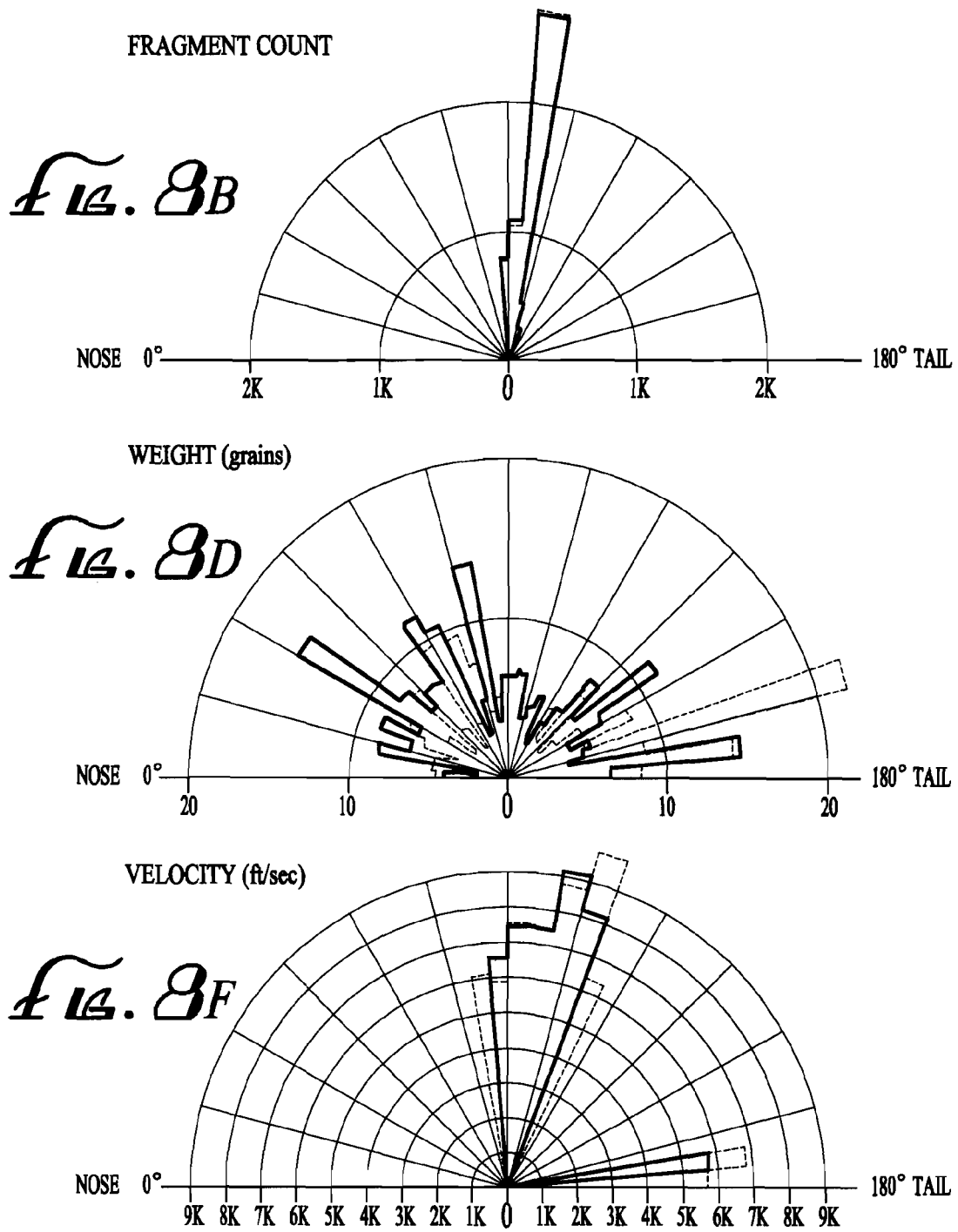

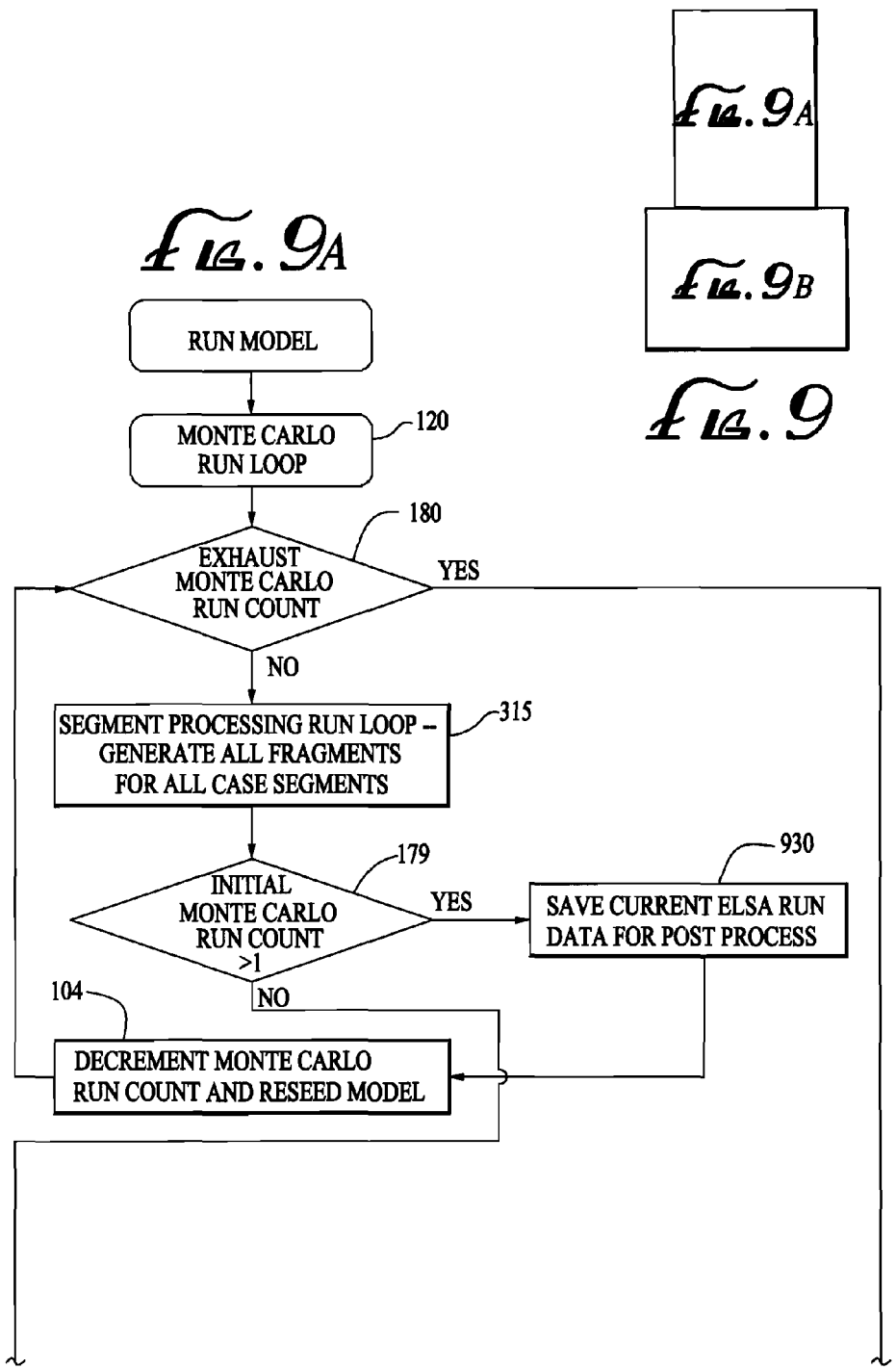

METHOD AND ARTICLE OF MANUFACTURE FOR DETERMINING WARHEAD FRAGMENTATION PERFORMANCE

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefore.

BACKGROUND OF THE INVENTION

Generally, an arena test consists of the detonation of a warhead to propel fragments that then become embedded in the arena walls, accompanied by a gathering of the data associated with those embedded fragments.

The rough estimation of warhead fragmentation performance has been accomplished through the application of the basic theories of Taylor, Mott, Gurney, and Shapiro. More specifically, in the past, a legacy warhead evaluation process ("legacy process") has been used to roughly predict warhead performance. The Taylor, Mott, Gurney, and Shapiro theories were applied using warhead physical characteristics and dimensions. The first applied theory was that of Taylor, which is used to determine a Taylor angle. A Taylor angle describes the fragmentation ejection angle for a limiting deflection of a plane detonation wave using a warhead model that approximates a long right cylinder model. The next applied theory was that of Mott. Mott uses a weight scaling equation to determine an average fragment weight. The next theory was that of Gurney. The Gurney equation predicts a fragment velocity. The next applied theory was that of Shapiro. Shapiro was used to determine a Shapiro angle, which provides a generalized fragment ejection angle based on a non-plane detonation wave for a general cylinder model. The theories are then applied to each of the discrete warhead model case segments as defined for a warhead model. The warhead model is defined geometrically and then divided into theoretical slices, where each slice is a discrete warhead model case segment.

For each discrete warhead model case segment the "legacy" theories applied above produced an average fragment weight, an average fragment velocity, an average fragment direction, and a fragment count. Thus, three numbers characterized the fragmentation for each warhead model case segment. The results for each discrete warhead model case segment were then averaged, and an average performance model for a warhead was produced. The "legacy" process does not model the true nature of the warhead detonation because the true nature of a warhead fragmentation distribution is continuous in weight, velocity, and direction, and not discrete. Further, the "legacy" process, and other prior processes, did not include means for modeling end fragments. The "legacy" process also did not include a Monte-Carlo model round-to-round variability because the legacy process did not include the effects of continuous distributions nor did it include randomness.

SUMMARY

One embodiment of the invention is directed to a warhead performance modeling computer program product in a computer readable medium having computer readable program code recorded thereon, wherein the computer readable program code include sets of instructions.

One exemplary embodiment of the invention includes loading computer instructions for causing a computer to read and store a parameters file and a warhead file; the warhead file provides information indicating the number of warhead model case segments in a warhead. The exemplary embodiment also includes warhead model setup instruction(s) for causing a computer to set up a warhead model. The warhead model includes an average fragment weight per warhead model case segment, an average fragment velocity per warhead model case segment, and an average fragment ejection angle per warhead model case segment. The embodiment also includes a plurality of sets of computer instructions for executing a segment loop; a maximum number of iterations of the segment loop is equal to the number of warhead model case segments in the warhead (indicated by information provided in the warhead file). The exemplary embodiment includes warhead model retrieval and fragment count instructions programmed to operate within the segment loop for causing a computer to retrieve/recall data included in the warhead model. The exemplary embodiment also includes distribution setup computer instructions programmed to operate within the segment loop for causing a computer to set up a fragment weight distribution, a fragment velocity distribution, and a fragment ejection angle distribution. The exemplary embodiment also includes a plurality of sets of computer instructions for executing a fragment loop programmed to operate within the segment loop; a maximum number of iterations of the fragment loop is equal to the number of fragments in the warhead model case segment. The exemplary embodiment also includes setup distributions retrieval instructions programmed to operate within the fragment loop for causing the computer to retrieve the setup distributions. The exemplary embodiment also includes a working value generating instruction(s) programmed to operate within the fragment loop and controlling a plurality of parameterized random number generators, the working value generating instruction(s) including instructions for causing a computer to:

use each of the retrieved setup distributions to parameterize one of the random number generators based at least in part by one of the retrieved setup distributions such that each of the random number generators is parameterized at least in part by one of the retrieved setup distributions, initialize at least one of the parameterized random number generators to produce an output, generate a fragment performance profile using the outputs, the fragment performance profile including a working value fragment weight, a working value fragment velocity, and a fragment working value ejection angle, and store the fragment performance profile in a fragment performance data structure.

The exemplary embodiment also includes a correlation instruction(s) for causing a computer to execute a correlation loop programmed to operate within the fragment loop. The correlation loop iterates through the setup distribution(s) retrieval instructions and the working value generating instruction(s) for generating a fragment performance profile using the outputs until a correlation between a plurality of the working values has been established.

The exemplary embodiment also includes end fragment generating instruction(s) programmed to execute within the fragment loop for causing a computer to generate end fragments. The end fragment instructions use as input a polar working value fragment ejection angle, $W_{frag_{ejection-polar}}$. The end fragment generating instruction(s) having computer readable code for causing a computer to generate a first random number D and a second random number X, and comparing X to D. The end fragment generating instruction(s) include instructions for causing the computer to exit the end fragment generating instruction(s) when X is less than or equal to D. The end fragment generating instruction(s) include instructions for causing the computer to do the following when X is greater than D:

1) generate Theta1 ($\theta_1$), a random value greater than or equal to zero (0) and less than or equal to one hundred and eighty (180), compare Theta1 ($\theta_1$) to $W_{frag_{ejection\ polar}}$, and:

when Theta1 ($\theta_1$) is greater than or equal to $W_{frag_{ejection\ polar}}$, generate a random angle Theta2a ($\theta_{2a}$), update and store the value of $W_{frag_{ejection\ polar}}$ to be equal to Theta2a ($\theta_{2a}$);

when Theta1 ($\theta_1$) is less than $W_{frag_{ejection\ polar}}$, generate a random angle Theta2b ($\theta_{2b}$), update and store the value of $W_{frag_{ejection\ polar}}$ to be equal to Theta2b ($\theta_{2b}$);

2) generate a random number Y, compare Y to the Random Velocity Cutoff, and:

when Y is greater than the Random Velocity Cutoff, generate a multiplier $m_{1a}$ such that the multiplier is equal to the sin($W_{frag_{ejection\ polar}}$), multiply the working value fragment velocity, ($W_{frag_{velocity}}$), for the fragment as determined in the working value generating computer instructions by $m_{1a}$ and store the product as the working value fragment velocity, ($W_{frag_{velocity}}$), in the fragment performance profile in the fragment performance data structure;

when Y is not greater than the Random Velocity Cutoff, generate a random number Z, generate a multiplier such that the multiplier ($m_{1b}$) is equal to Z*sin($W_{frag_{ejection\ polar}}$), multiply the working value fragment velocity, ($W_{frag_{velocity}}$), for the fragment as determined in the working value generating computer instructions by $m_{1b}$, store the product as the working value fragment velocity, ($W_{frag_{velocity}}$) in the fragment performance profile in the fragment performance data structure.

When multiple Monte Carlo iterations are to be performed, the exemplary embodiment also includes instructions for causing the computer to determine whether a Monte Carlo iteration remains to be performed. When another Monte Carlo iteration remains to be performed, the exemplary embodiment includes instructions for causing the computer to save the data from the current Monte Carlo iteration in computer memory such that the computer can distinguish data from previous Monte Carlo iterations, re-seed the random number generators, and analyze the warhead again. The exemplary embodiment also includes a user-defined format generating instruction(s) for causing a computer to process the field performance data structure. The processing results in a statistically based warhead performance model wherein the statistically based warhead performance model can be used to predict a warhead performance.

BRIEF DESCRIPTION OF THE DRAWINGS

FIGS. 1A-C are a high level flow diagram according to an embodiment of the invention.

FIGS. 2A and 2B depict a more detailed flow diagram of blocks 110 and 115 in FIG. 1.

FIG. 5A depicts a partially segmented warhead with angular references relating to a fragment ejection angle.

FIG. 5B illustrates one embodiment of a cylindrically cross-sectional view of a warhead with angular references to the roll angle.

FIG. 6A illustrates the geometry used to determine the fragment ejection angle.

FIG. 6B is a flow diagram illustrating how to convert a fragment ejection angle to a field polar angle according to an embodiment of the invention.

FIGS. 7A and 7B comprise a flow diagram illustrating the end fragment process according to an embodiment of the invention.

FIGS. 8A-8F each show a partial visual depiction of the output of one embodiment of the invention, presented as fragmentation performance polar plots from runs for a 2.75 inch rocket warhead.

FIGS. 9A-B provide a flowchart of a Monte Carlo loop according to an embodiment of the invention.

DETAILED DESCRIPTION OF THE EMBODIMENTS

Figure 1B:
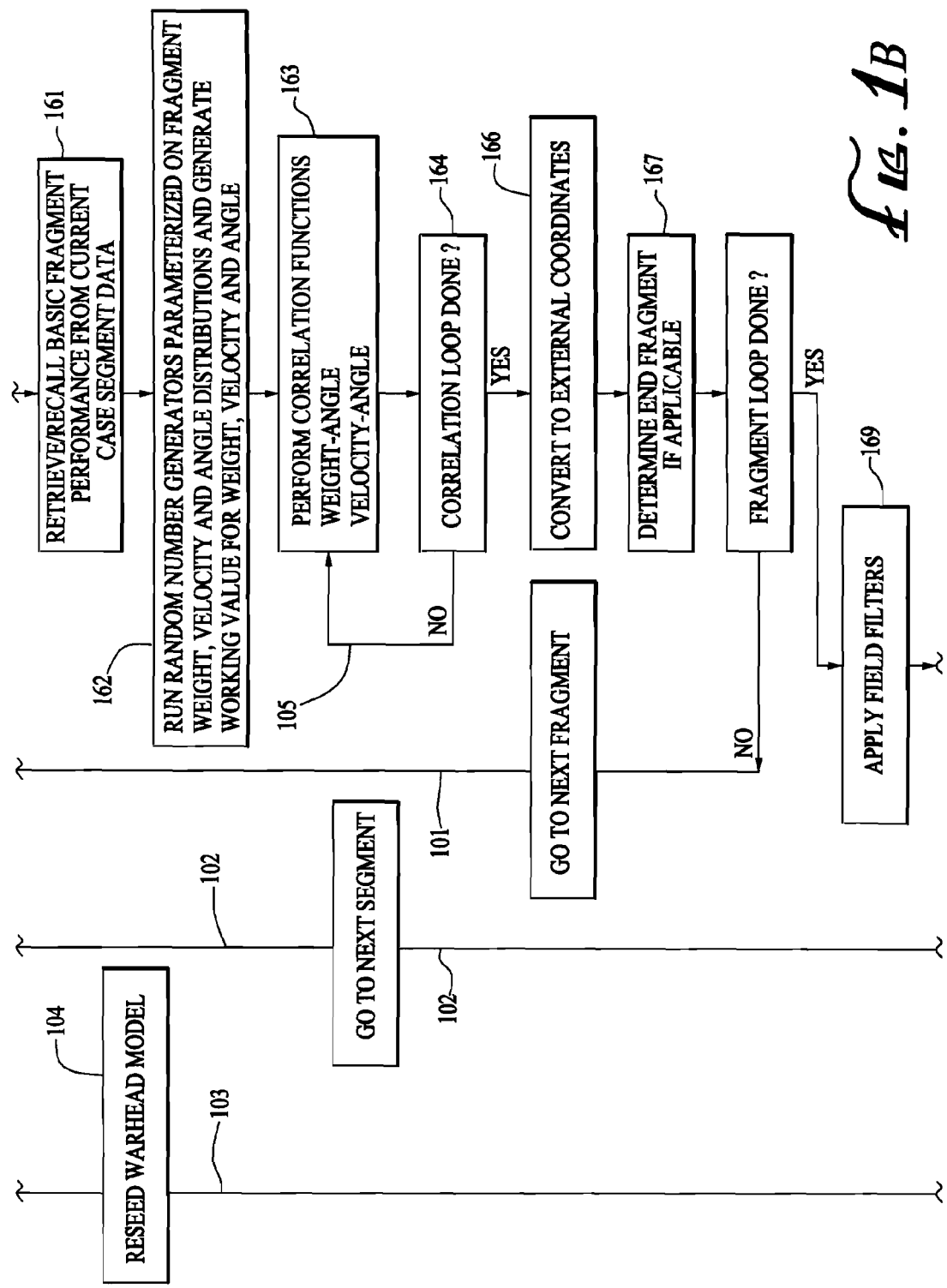

Although embodiments of the invention are described in considerable detail, including references to certain versions thereof, other versions are possible. Examples of other versions include performing the steps in an alternate sequence, reconstructing the loops to populate data structures in a different order, or hosting the program on a different platform. Therefore, the spirit and scope of the appended claims should not be limited to the description of versions contained herein.

Embodiments of the invention may take the form of a computer program product on a computer-usable storage medium having computer-usable/readable program code embodied in the medium. Any suitable computer readable medium may be utilized including either computer readable storage mediums, such as, for example, hard disks, CD-ROMs, optical storage devices or magnetic storage devices, or a transmission media, such as, for example, those supporting the internet or an intranet.

Computer-usable/readable program code for carrying out operations of embodiments of the invention may be written in an object oriented programming language such as, for example, Python, Visual Basic, or C++. However, computer-usable/readable program code for carrying out operations of embodiments of the invention may also be written in conventional procedural programming languages, such as, for example, the "C" programming language. The computer-usable/readable program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider or any other method known in the art).

Embodiments of the invention are described in part below with reference to flow chart illustrations and/or block diagrams of methods, apparatus (systems) and computer program products according to embodiments of the invention. It will be understood that each block of the flow chart illustrations and/or block diagrams, and combinations of blocks in the flow chart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow chart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flow chart and/or block diagram block or blocks.

These computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flow chart and/or block diagram block or blocks.

Figure 1C:
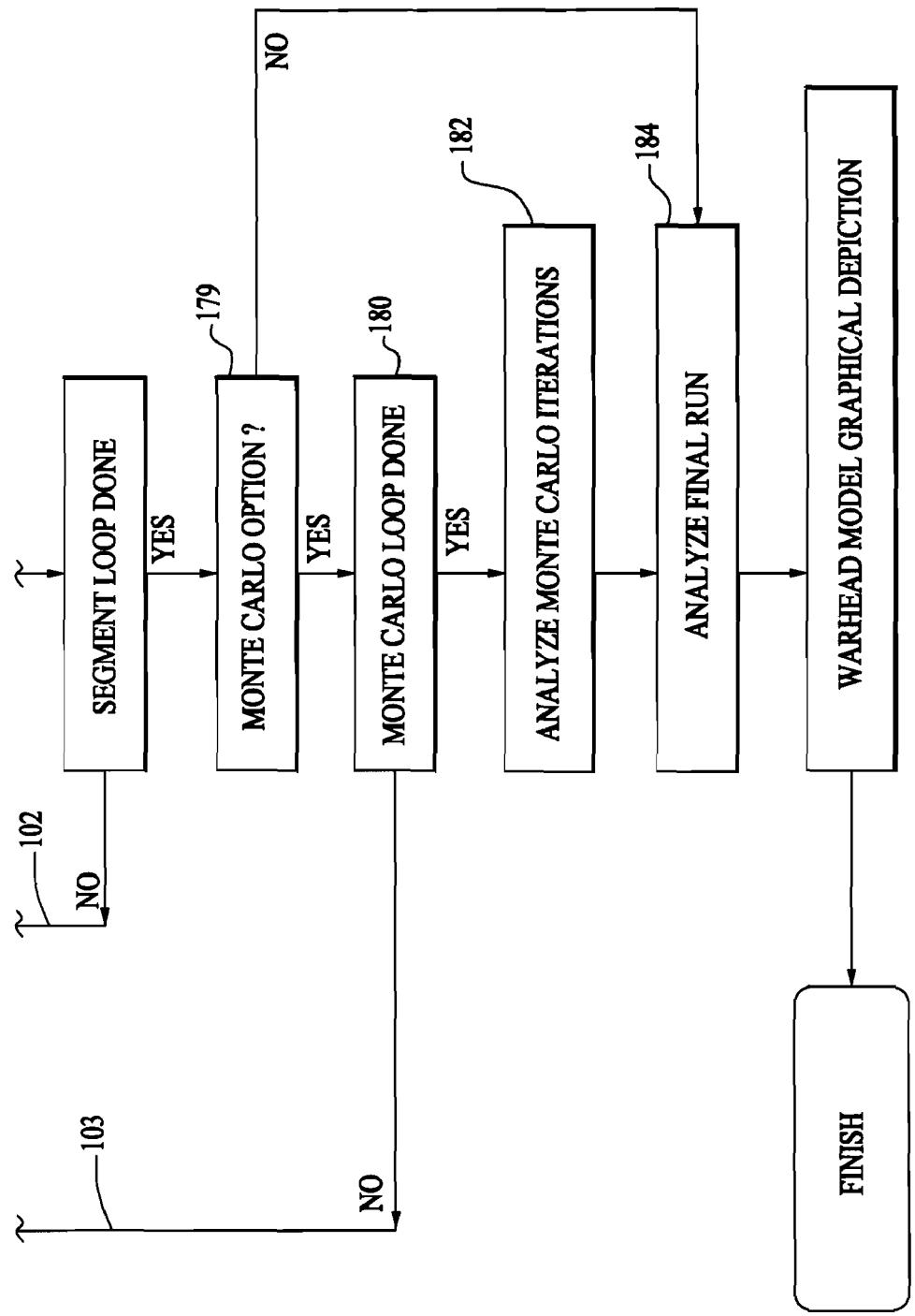

A general overview of one embodiment of the invention is depicted in FIGS. 1A, 1B, and 1C. The user/operator may choose to process the warhead more than once, i.e., perform multiple runs (or Monte Carlo iterations), in which case, the user will input, using an interface, the number of Monte Carlo iterations to be performed. The default number of Monte Carlo iterations is one (1).

A computer program product in accordance with embodiments of the invention includes instructions (or a set of instructions) for causing a computer to accept as input (read and store; load) what are referred to in this specification, including the claims, as a warhead file (step 110) and a parameters file (step 110) (referred to in this specification, including the claims, as "loading instructions"). The parameters file specifies the correlation parameters, ($C_w$, $C_v$), field filters, the model (or Monte Carlo) seed, and rules (for example whether a distribution will be a beta distribution, normal distribution, or some other type of distribution) for continuous model distributions (set up using a set of instructions described infra., as represented in block 140 in FIG. 1) comprising a fragment ejection angle distribution, a fragment velocity distribution, and a fragment weight distribution. The model (or Monte Carlo) seed is the seed for a given Monte Carlo iteration that is used to initiate, or seed, all random number generators in a Monte Carlo iteration. A user can select/input a model seed value using an interface. When no model (or Monte Carlo iteration) seed is selected/input, the model seed is generated from the computer's system clock. The warhead file includes a set of user defined warhead parameters. The user defined warhead parameters contained within the warhead file include the warhead description data, including the explosive type and characteristics, including the explosive detonation velocity ($v_d$), warhead case data (including warhead case dimension, case thickness, and weight), and warhead model case segments description; the parameters contained within the warhead file define the polar zones, and include fragmentation and field data, including the fragment weight parameter, and the warhead field configuration. The warhead model case segment lengths included in the warhead model case segments description in the warhead data file are ideally selected such that each warhead model case segment, 515 in FIG. 5A, is as long as possible, consistent with matching the actual warhead case profile 510. In one embodiment, an ideal fragment weight distribution results were obtained by using a warhead model that is cylindrically symmetric about the z-axis (z-axis illustrated in FIG. 5A).

An analysis using a plurality of warhead model case segments (a segmented warhead model) raises the question of how long to make each warhead model case segment, 515 in FIG. 5A. At this time, no guidance on warhead model case segment length has been found in the literature and the choice of warhead model case segment length is rather arbitrary. Large warhead model case segment lengths provide more justification for the non-interacting warhead case segment assumptions, at the expense of losing fragmentation fine structure along the warhead or device length. Very small warhead model case segment lengths probably violate the non-interaction assumption. Small warhead model case segment lengths appeared to violate the long-cylinder assumptions made by the pioneers in warhead modeling until it was realized that the long-cylinder assumption is just another way of saying that the detonation wave is planar as it propagates along the warhead to be modeled. To a first approximation, a detonation wave tends to become planar as it propagates from one end to the opposite end of the model cylinder. Thus, the warhead segments that are far from the end of explosive initiation will experience a plane wave no matter what length the warhead model segments are.

A computer program product in accordance with embodiments of the invention has instructions (or a set of instructions) for causing a computer to set up a warhead model (referred to in this specification, including the claims, as "warhead model setup instructions") (generally shown as block 115 in FIG. 1A; generally represented by block 115 in FIG. 2A and more particularly represented by blocks 250, 260, 270, 280, 290, 300, and 310 in FIG. 28).

Figure 2B:
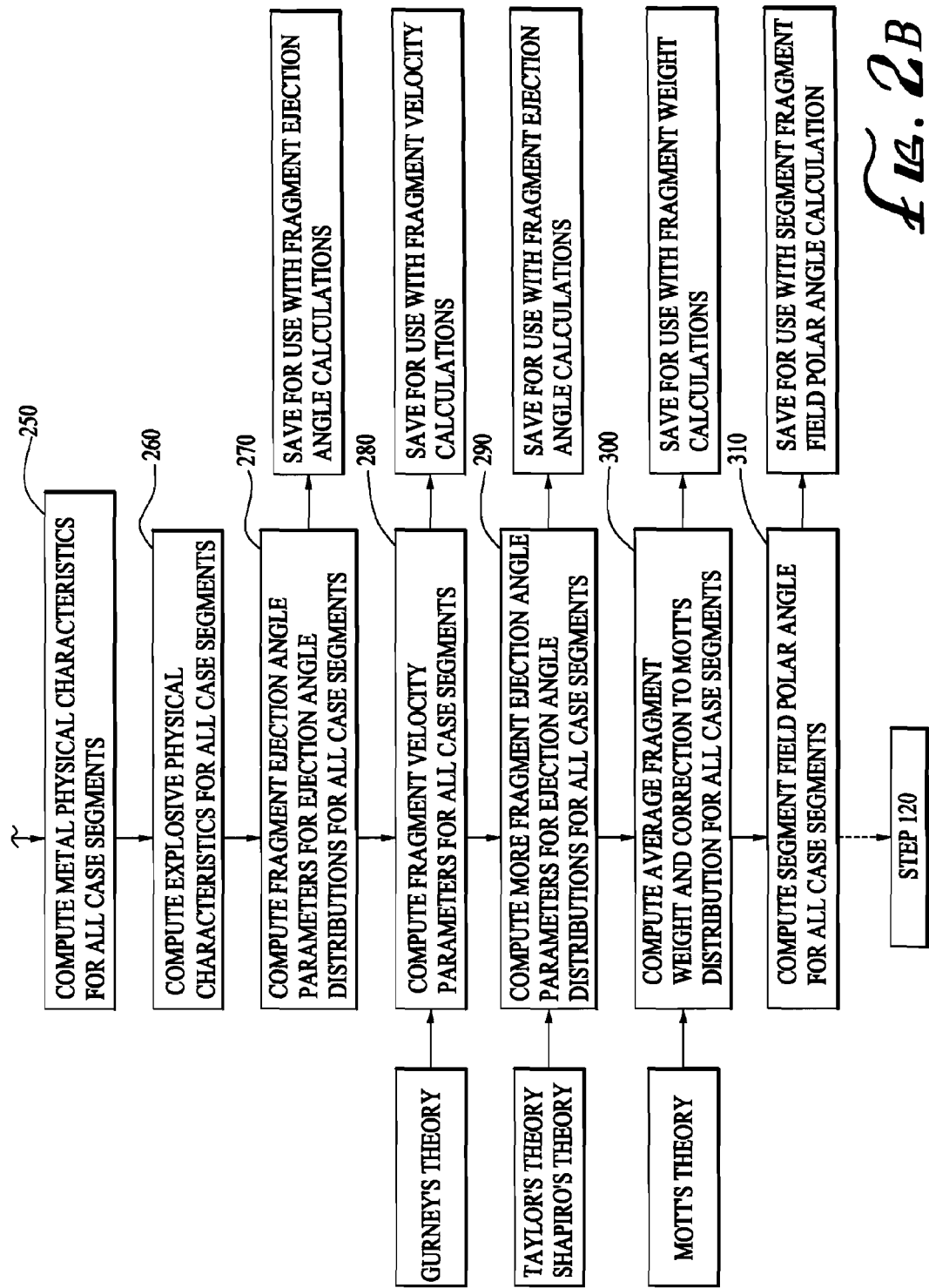

The warhead model setup instructions used to set up a warhead model include instructions for causing a computer to compute the metal physical characteristics for each warhead model case segment (block 250) by any known method using information contained in the warhead file (block 110 in FIGS. 1A and 2A). The metal physical characteristics include, for each warhead model case segment, 515 in FIG. 5A, a metal volume, an interior volume (the volume the warhead model case segment encloses), and inside and outside surface normal angles. The warhead model setup instructions include instructions for causing a computer to compute the explosive physical characteristics for each warhead model case segment 515 (block 260 in FIG. 2B) by any known method using information contained in the warhead file (block 110 in FIGS. 1 and 2A). The explosive physical characteristics include, for each warhead model case segment, 515 in FIG. 5A, a volume and weight for the explosive in the warhead model case segment 515, and a charge to metal ratio for the warhead model case segment 515. The warhead model setup instructions include instructions for causing a computer to compute, for each warhead model case segment 515, warhead model case segment parameters associated with determining a warhead model case segment fragment ejection polar angle (average fragment ejection angle for the warhead model case segment) ($\phi_s$, FIG. 6A) (block 270 in FIG. 28) for the warhead model case segment using information from the warhead file (block 110 in FIGS. 1 and 2A). The warhead model case segment parameters associated with determining a warhead model case segment fragment ejection polar angle (average fragment ejection angle for the warhead model case segment) ($\phi_s$, FIG. 6A) for the warhead model case segment, 515 in FIG. 5A, include an inside case surface normal vector for the warhead model case segment ($\hat{\eta}$, FIG. 6A), which is perpendicular to the inside case surface cross line (808, FIG. 6A), (which is a straight line that intersects the intersections 810 and 812 of the warhead model case segment boundaries (802, 804, FIG. 6A) and the inside case surface (816, FIG. 6A)), and its corresponding inside case surface normal angle, ($\phi_1$, FIG. 6A). 806 marks the longitudinal (along the x-axis in FIG. 6A and the z-axis in FIG. 5A) center of the warhead. 814 in FIG. 6A points to the illustrated portion of an exemplary warhead case. The warhead model setup instructions include instructions for causing a computer to save in computer memory the computed warhead model case segment parameters associated with determining a fragment ejection polar angle (average fragment ejection angle for the warhead model case segment) ($\phi_s$, FIG. 6A) (block 270 in FIG. 2B) for the warhead model case segment, 515 in FIG. 5A. The warhead model setup instructions include instructions for causing a computer to compute, for each warhead model case segment 515, warhead model case segment fragment velocity parameters (block 280) using information from the warhead file (block 110 in FIGS. 1 and 2A); the warhead model case segment fragment velocity parameters for the warhead model case segment, 515 in FIG. 5A, include a Gurney fragment velocity for the warhead model case segment $v_f$ using Gurney's equation for cored cylinders (Equation 1) and a Taylor angle using Taylor's theory (Equation 2). The Taylor angle is measured from the inside case surface normal vector ($\hat{\eta}$, FIG. 6A) and, for many devices/warheads, is rarely much larger than about 8.5 degrees. The Taylor angle is a function of the detonation velocity and the Gurney fragment velocity. The Taylor angle is the limiting value of the Shapiro angle (Equation 3), meaning that the absolute value of the Shapiro angle cannot be larger than the absolute value of the Taylor angle.

$$v_f = G_C \left( \frac{M}{C} + \frac{a+3}{6(a+1)} \right)^{-\frac{1}{2}} \quad (1)$$

where:
$v_f$=Gurney average fragment velocity
$G_C$=Gurney Constant for the explosive in the warhead
M=case weight
C=explosive weight $$a = \frac{r_c}{r_i} = \frac{\text{core radius}}{\text{case inside radius}}$$

$r_c$=core radius=radius of a cylindrical hollow of a warhead model case segment, usually for placement of a fuze
$r_i$=case inside radius of a warhead model case segment $$\sin(\gamma_t) = \left( \frac{v_f}{2v_d} \right) \quad (2)$$

where:
$\gamma_t$=Taylor angle
$v_f$=Gurney fragment velocity
$v_d$=explosive detonation velocity The warhead model setup instructions include instructions for causing a computer to save in computer memory the computed warhead model case segment velocity parameters for each warhead model case segment for use with fragment velocity calculations—including setting up the fragment velocity distribution, which occurs using a set of instructions described infra., as represented in block 140 in FIG. 1. The warhead model setup instructions include instructions for causing a computer to compute a warhead model case segment fragment ejection polar angle (average fragment ejection angle for the warhead model case segment) ($\phi_s$, FIG. 6A) for the warhead model case segment (for use with ejection angle distributions) for all warhead model case segments using Shapiro's theory (Equation 3), limited where applicable by Taylor's theory, and Equation 4 (block 290 in FIG. 2B).

$$\tan(\gamma_s) = \left( \frac{v_f}{2v_d} \right) \cos(\phi_2) \quad (3)$$

where:
$\gamma_s$=Shapiro deflection angle
$\phi_2$=angle of the warhead model case segment cross section center measured from the case nose.

Note that $\gamma_s$ is taken to be positive when the angle of the warhead model case segment fragment velocity vector, ($\overline{v}_0$, FIG. 6A), with respect to the z-axis, measured from the nose, is greater than the angle of the normal unit vector, ($\hat{f}$, FIG. 6A), with respect to the z-axis, measured from the nose; $\gamma_s$ is taken to be negative when the angle of the warhead model case segment fragment velocity vector, ($\overline{v}_0$, FIG. 6A), with respect to the z-axis, measured from the nose, is less than the angle of the normal unit vector, ($\hat{\eta}$, FIG. 6A), with respect to the z-axis, measured from the nose. Knowing the Shapiro deflection angle, $\gamma_s$, the warhead model case segment fragment ejection angle (average fragment ejection angle for the warhead model case segment) ($\phi_s$, FIG. 6A) is computed using Equation 4.

$$\phi_s = \phi_1 + \gamma_s \quad (4)$$

where,
$\phi_1$=inside case surface normal angle
$\gamma_s$=Shapiro deflection angle as computed using Equation 3

The warhead model setup instructions include instructions for causing a computer to save in computer memory the Shapiro deflection angle, $\gamma_s$, and the warhead model case segment fragment ejection angle (average fragment ejection angle for the warhead model case segment) ($\phi_s$, FIG. 6A)—for use with setting up the fragment ejection angle distributions (fragment ejection angle distributions are set up using a set of instructions described infra., as represented in block 140 in FIG. 1). The warhead model setup instructions include instructions for causing a computer to compute a warhead model case segment fragment weight ($\overline{m}_{finaliteration}$) for each warhead model case segment, ($\overline{m}_{finaliteration}$), by applying an iterative correction (Equation 6) (iterated until successive values of $\overline{m}_{n+1}$ differ by <0.1 grain) to the uncorrected warhead model case segment fragment weight, $\overline{m}_0$, (Equation 5) (block 300), using information in the warhead file (block 110 in FIGS. 1 and 2A).

$$\overline{m}_0 = 2B^2 t^{\frac{5}{3}} d_i^{\frac{2}{3}} \left( 1 + \frac{t}{d_i} \right)^2 \quad (5)$$

where:
$\overline{m}_0$=uncorrected warhead model case segment fragment weight
B=Mott factor
t=warhead model case segment thickness
$d_i$=case inside diameter of a warhead model case segment=$2r_i$ $$\overline{m}_{n+1} = \frac{\overline{m}_0}{2}\left[2 - \frac{\overline{m}_n}{W_{seg}}\left(\ln^2\left(\frac{W_{seg}}{\overline{m}_n}\right) + 2\ln\left(\frac{W_{seg}}{\overline{m}_n}\right) + 2\right)\right] \quad (6)$$

where:
$\overline{m}_0$=uncorrected warhead model case segment fragment weight,
$\overline{m}_n$=$n^{th}$ iteration of corrected average fragment weight;
$\overline{m}_n$=$\overline{m}_0$ during a first Monte Carlo iteration,
$\overline{m}_{n+1}$=$(n+1)^{th}$ iteration of corrected average fragment weight,
$W_{seg}$=warhead model case segment weight For each warhead model case segment, the final iteration of the correction to the Mott result (using Equation 6), $\overline{m}_{finaliteration}$, is taken to be the warhead model case segment fragment weight (average fragment weight for the warhead model case segment). For each warhead model case segment, the warhead model setup instructions include instructions for causing a computer to save in computer memory the uncorrected warhead model case segment fragment weight, $\overline{m}_0$, and warhead model case segment fragment weight, $\overline{m}_{finaliteration}$, for use with fragment weight calculations, including setting up the fragment weight modified-Mott distribution, which occurs using a set of instructions described infra., as represented in block 140 in FIG. 1.

Figure 3:
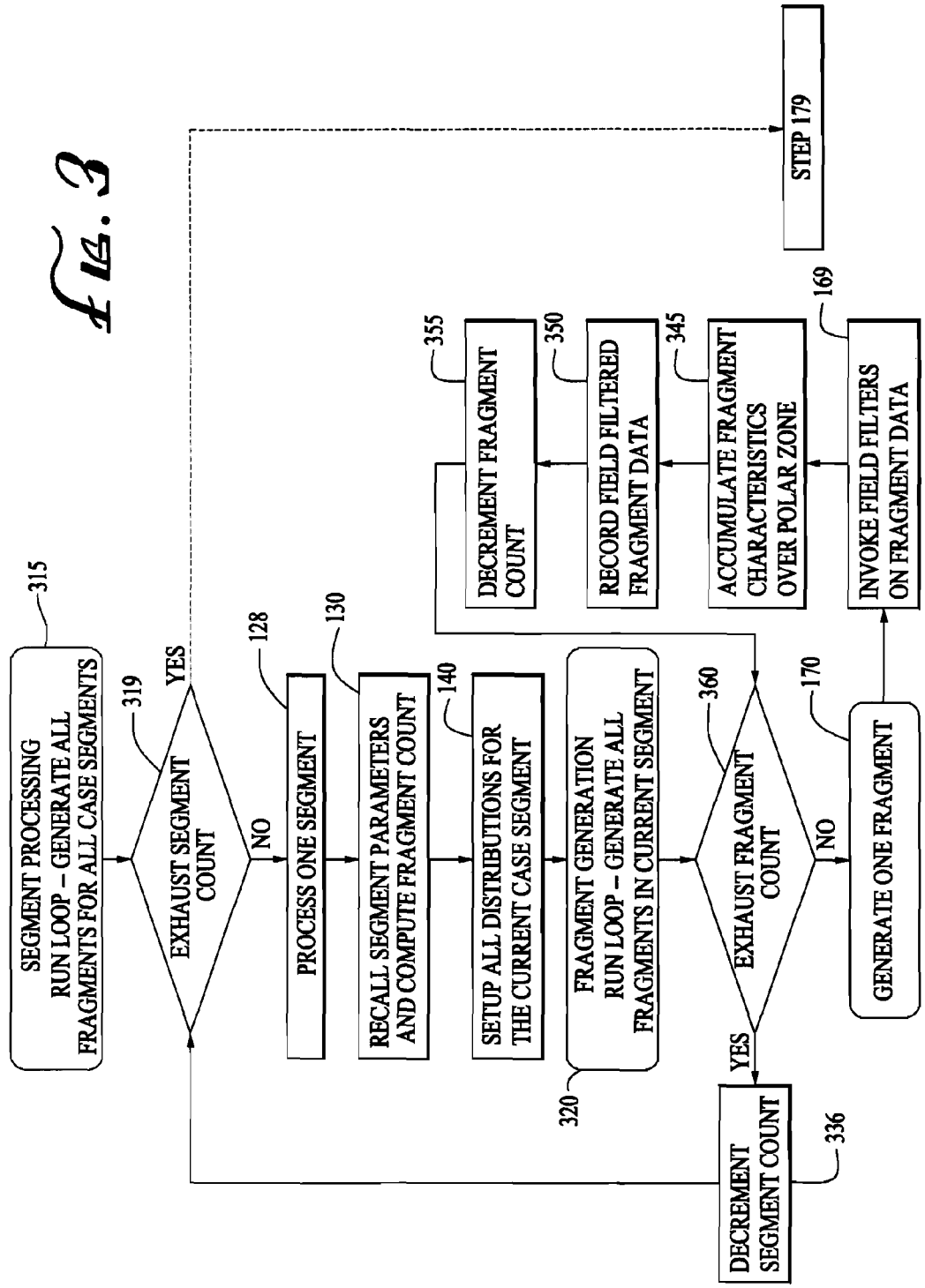
FIG. 3 is a data flow diagram of the segment loop according to an embodiment of the invention.

FIG. 3 is a flowchart of a "segment loop" according to one embodiment of the invention; a "segment loop" is also marked in FIG. 1 with arrow line 102. For each Monte Carlo iteration, each warhead model case segment, 515 in FIG. 5A, is processed individually in a segment loop until each warhead model case segment 515 in the warhead 510 is processed. Within the segment loop, for each warhead model case segment 515, embodiments of the invention include instructions for causing a computer to recall the warhead model (found in blocks 250, 260, 270, 280, 290, 300, 310 in FIG. 2B) and compute a "fragment count" (blocks 130 in FIGS. 1 and 3) using the computed warhead model case segment fragment weight $\overline{m}_{finaliteration}$ and warhead model case segment weight $W_{seg}$ (referred to in this specification, including the claims, as "warhead model retrieval and fragment count instructions"). The invention includes instructions that, for each warhead model case segment, use the warhead model case segment fragment ejection angle (average fragment ejection angle for the warhead model case segment), ($\phi_S$, FIG. 6A), warhead model case segment fragment weight, $\overline{m}_{finaliteration}$ and Gurney fragment velocity, $v_f$, to set up a distribution for each characteristic (fragment weight, fragment velocity, and fragment ejection angle). For each characteristic, a random number generator is used to generate a random number from a random variable distributed according to one of the setup distributions. Embodiments of the invention include instructions for causing a computer to cause an electronic uniform random number generator to generate a random number based on a distribution generated to approximate the statistical distribution of each characteristic. Described infra is one implementation of a method for causing an electronic random number generator to generate a random number based on a distribution generated to approximate the statistical distribution of each characteristic; however, other approaches for causing an electronic random number generator to generate a random number based on a distribution, including but not limited to the inverse transform method, designed to approximate the statistical distribution of each characteristic should be known to a person having skill in the art.

Within the segment loop, for each warhead model case segment 515 in FIG. 5A, embodiments of the invention include instructions for causing a computer to set up distributions for each characteristic (fragment weight, fragment velocity, and fragment ejection angle) for the warhead model case segment 515 (blocks 140 in FIGS. 1 and 3) using a number of constants (calculated in steps 250, 260, 270, 280, 290, 300, 310 or contained within the parameters file (block 110 in FIG. 2)) as input setup parameters (referred to in this specification, including the claims, as "distribution setup instructions"). Fragment size, that is, dimensions, is estimated from the fragment weight for different materials using empirical rules derived from field data. Fragment location in the warhead model case segment is determined using independent, uniform random number generators that specify each fragment's position along the warhead model case segment length and in roll angle about the warhead model case segment axis. The distribution setup instructions include instructions for causing a computer to store in computer memory the setup fragment weight distribution, fragment velocity distribution, and fragment ejection angle distribution for the current warhead model case segment 515.

The distribution setup instructions include instructions for causing a computer to setup/create a fragment weight distribution for the current warhead model case segment 515 using the modified Mott distribution function in Equation 7. The range of the fragment weight distribution is from 0 to $m_{max}$.

$$N(m) = N_0\left(e^{-\sqrt{\frac{2m}{\overline{m}_{finaliteration}}}} - e^{-\sqrt{\frac{2m_{max}}{\overline{m}_{finaliteration}}}}\right) \quad (7)$$

where:
$N_0$=total number of fragments from warhead model case segment
m=single fragment mass
N(m)=number of fragments of mass m from warhead model case segment
$\overline{m}_{finaliteration}$=warhead model case segment fragment weight $$m_{max} = \frac{1}{2}(\ln(N_0))^2 = \text{maximum fragment mass for warhead model case segment}$$

The desired distribution for modeling fragment velocities and fragment ejection angles is the beta distribution. The beta distribution is flexible and also has the desirable characteristic of having a finite domain. In this regard it is realized that most other commonly used analytic distributions have either an infinite domain, such as, for example, the normal distribution, or a semi-infinite domain, such as, for example, the exponential. The beta distribution has a domain of [0,1], i.e., defined on the interval [0,1], (the [0,1] domain is referred to as "unscaled"), that can be scaled as needed. The beta distribution domain can be made to correspond to the finite range of physical processes such as, for example, velocity and ejection angle.

The density function for the standard beta distribution can be written as:

$$b(x, r, s) = \frac{x^{(r-1)}(1-x)^{(s-1)}}{\text{Beta}(r, s)} \quad (8)$$

where:
Beta(r,s) is the beta function and appears as a normalization constant to ensure that the total probability integrates to unity,
r is a distribution shape factor,
s is a distribution shape factor,
x is a random variable.

The integral of the density function of Equation 9 over some range of x corresponds to the Microsoft Excel function: BETADIST(x,Alpha,Beta). The desired approach, described in this specification, sets up fragment velocity, and fragment ejection angle, distributions that are scaled, non-normalized versions of a standard beta distribution (Equation 8). The distribution shape factors of the fragment velocity distribution ($r_v$ and $s_v$) and the fragment ejection angle distribution ($r_e$ and $s_e$) selected for use in a method in accordance with the invention are greater than 1.0, and thus the density functions describing the fragment velocity distribution and fragment ejection angle distribution are humped density functions. Setting up these distributions is a process of controlling the position and shape of the hump.

The fragment velocity distribution for each warhead model case segment 515 is set up by scaling a non-normalized version of the standard beta distribution in Equation 9 from 0 to $\sqrt{2}G_C$, ($G_C$ is provided in the warhead file, block 110 in FIGS. 1 and 2A), producing a non-normalized scaled beta distribution that is parameterized by the velocity shape factors ($r_v$ and $s_v$), as described by the density function in Equation 10. The non-normalized, scaled (from 0 to $\sqrt{2}G_C$) beta distribution described by the density function in Equation 9 is referred to in this specification including the claims as the "fragment velocity distribution". It is noted that Equation 10 does not present a density function that describes a standard beta distribution because a standard beta distribution is defined on the interval [0,1] and is normalized.

$$v(x_v, r_v, s_v) = x_v^{(r_v-1)}(1-x_v)^{(s_v-1)} \quad (9)$$

where:
v=fragment velocity probability density function
$x_v$=fragment velocity
$K_v=r_v+s_v$=fragment velocity shape parameter, which serves as a constraint
$r_v=\lambda_v(K_v-2)+1$=fragment velocity distribution shape factor
$s_v=(K_v-r_v)$=fragment velocity distribution shape factor $$\lambda_v = \frac{v_f}{\sqrt{2}\,G_C} = \text{distribution normalized peak position}$$

distribution normalized peak position
$v_f$=Gurney fragment velocity
$G_C$=Gurney constant In one embodiment, the finite domain of the fragment velocity distribution is selected to be (0 to $\sqrt{2}G_C$); in other words, the fragment velocity distribution is defined on the interval [0, $\sqrt{2}G_C$].

The significance of the Gurney fragment velocity, $v_f$, can vary as follows: 1) $v_f$ can be considered the most probable velocity; or 2) $v_f$ can be considered the average velocity. The interpretation of $v_f$ being the most probable velocity is a desired default interpretation.

In one embodiment where $v_f$ is selected to be the most probable velocity, the distribution setup instructions include instructions for causing a computer to set up the fragment velocity distribution for the current warhead model case segment using Equation 9, with the fragment velocity distribution shape factors ($r_v$ and $s_v$) computed as follows:

$$r_v=\lambda_v(K_v-2)+1; \text{ and} \quad (10)$$

$$s_v=K_v-r_v \quad (11)$$

A primary effect of changing $$\frac{C}{M}$$

is to move the distribution peak, i.e. the most probable velocity, around. For a given value of $G_C$, very high or very low values of $$\frac{C}{M}$$

tend to have sharper peaks for a given value of $K_v$ than mid-range values of $$\frac{C}{M}.$$

This is the effect of "squeezing" the peaks against the limits of the domain. Generally, the total kinetic energy of all of the fragments increases as $K_v$ becomes larger because the resulting narrow velocity distribution produces more higher velocity fragments.

In one embodiment where $v_f$ is selected to be the average velocity, the distribution setup instructions include instructions for causing a computer to set up the fragment velocity distribution for the current warhead model case segment using Equation 9, with the fragment velocity distribution shape factors ($r_v$ and $s_v$) computed using Equations 12 and 13.

$$s_v=K_v(1-\lambda_v), \text{ and} \quad (12)$$

$$r_v=K_v-s_v \quad (13)$$

In another embodiment, sometimes referred to as a "flexi-beta method", where $v_f$ is selected to be the average velocity, the distribution setup instructions include instructions for causing a computer to set up the fragment velocity distribution for the current warhead model case segment 515 using Equation 10, with the fragment velocity distribution shape factors ($r_v$ and $s_v$) computed as follows:
1) compute a temporary $r_v$ using Equation 13;
2) compare the temporary $R_v$ with $$\frac{\lambda_v}{1-\lambda_v},$$

a) when the temporary $r_v$ as calculated in Equation 13

$$< \frac{\lambda_v}{1-\lambda_v},$$

then
set the shape factor $r_v$ to, $$r_v = \frac{\lambda_v}{1-\lambda_v}, \text{ and} \tag{14}$$

and (14) set $s_v=1$;
b) when the temporary $r_v$ as calculated in Equation 13

$$\geq \frac{\lambda_v}{1-\lambda_v},$$

then
set the distribution shape factor $r_v$ to $r_v=K_v$ (as set in parameters file) (block 110 in FIG. 2A), and
set $$s_v = \frac{1-\lambda_v}{\lambda_v}. \tag{15}$$

The distribution setup instructions include instructions for causing a computer to set up the fragment ejection angle distributions for each warhead model case segment 515 by scaling a non-normalized version of the beta distribution in Equation 8 from $-2(\gamma_t)$ to $2(\gamma_t)$ for a total range of four times the Taylor angle ($\gamma_t$) (computed in the warhead model setup instructions using Equation 2), producing a non-normalized scaled beta distribution that is parameterized by the fragment ejection angle shape factors ($r_e$, $s_e$) as described by the density function in Equation 16. The non-normalized scaled, (from $-2(\gamma_t)$ to $2(\gamma_t)$), beta distribution described by the density function in Equation 16 is referred to in this specification including the claims as the "fragment ejection angle distribution". The domain of the fragment ejection angle distribution ($-2(\gamma_t)$ to $2(\gamma_t)$) therefore covers angles less than and greater than 0 degrees measured from the inside surface case normal vector ($\hat{\eta}$ in FIG. 6A). It is noted that Equation 16 does not present a density function that describes a standard beta distribution because a standard beta distribution is defined on the interval [0,1] and is normalized.

$$a(x_e, r_e, s_e) = x_e^{(r_e-1)}(1-x_e)^{(s_e-1)} \tag{16}$$

where:
a=fragment ejection angle probability density function
$x_e$=warhead case segment fragment ejection angle=$\phi_s$
$K_e=r_e+s_e$=fragment ejection angle distribution shape parameter, which serves as a constraint
$r_e=\lambda_e (K_e-2)+1$=fragment ejection angle distribution shape factor
$S_e=(K_e-r_e)$=fragment ejection angle distribution shape factor $$\lambda_e = \frac{\gamma_t - \gamma_s}{2\gamma_t} =$$

fragment ejection angle distribution normalized peak position $\gamma_t$=Taylor's angle
$\gamma_s$=Shapiro's angle $\phi_s$ as calculated using Equation 4 is taken to be the warhead case segment fragment ejection angle and corresponds to the peak of the density function that describes the fragment ejection angle distribution. The fragment ejection angle distribution shape parameter, $K_e$, contained in the parameters file (block 110 in FIG. 2A) is used to parameterize the fragment ejection angle distribution. The fragment ejection angle distribution gets peakier as $K_e$ gets larger. The effect of adjusting the fragment ejection angle shape parameter, $K_e$, is subtler than adjusting the fragment velocity shape parameter, $K_v$, and no simple rules for determining behavior apply. This is especially true since the ejection angles are correlated with the fragment velocities via the Velocity Correlation Parameter in a complex way. Experience so-far indicates that an Ejection Angle Shape Parameter value of 10 may be used as a starting point.

Figure 4:
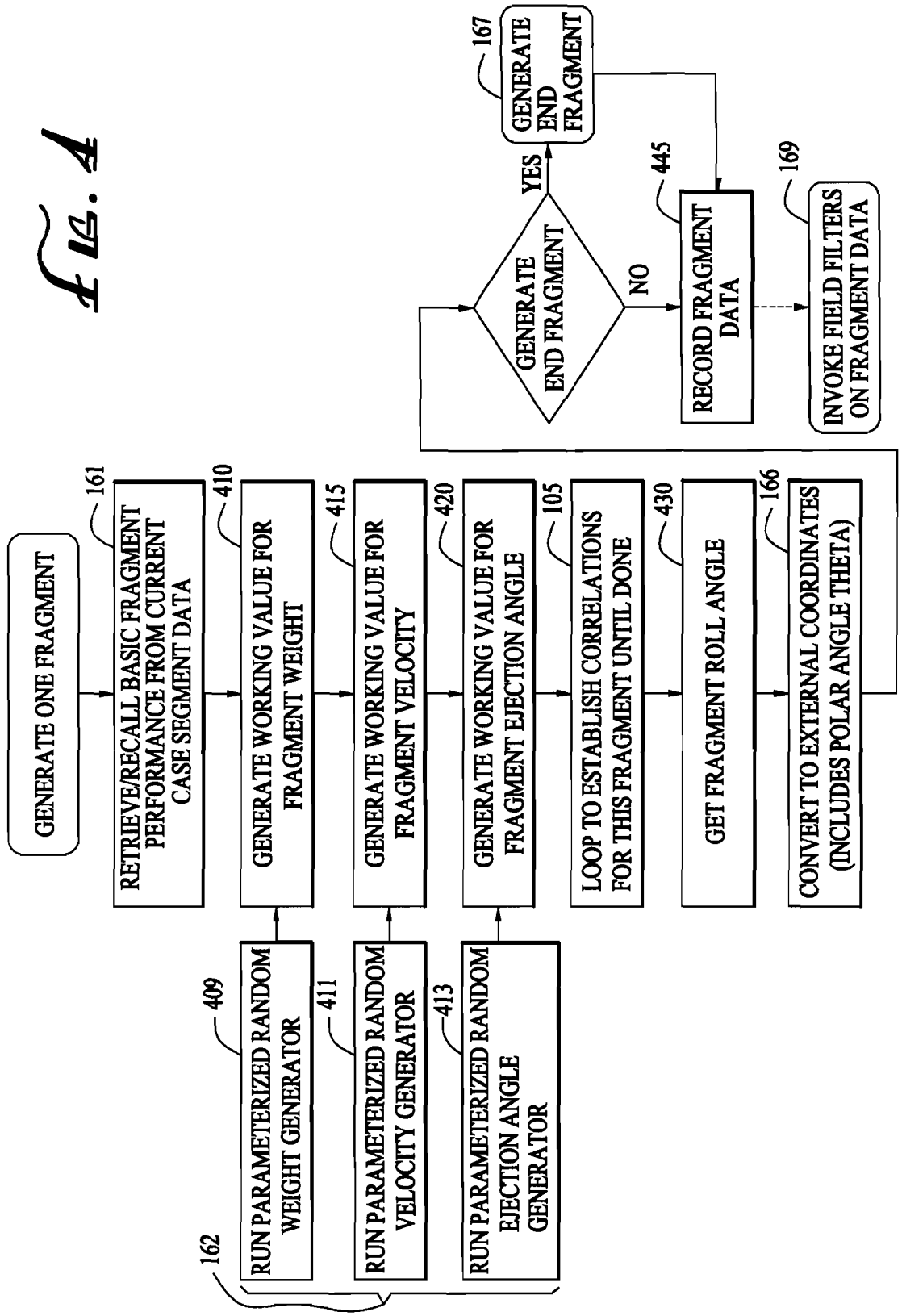
FIG. 4 is an expansion of one step in the data flow diagram of FIG. 3, depicting the fragment loop according to an embodiment of the invention.

Within the segment loop is a "fragment loop". FIG. 4 is a flowchart of a "fragment loop" according to one embodiment of the invention; a "fragment loop" according to an embodiment of the invention is also marked in FIG. 1 with arrow line 102. The term "fragment loop" describes a loop comprised of instructions (or sets of instructions) that evaluate each fragment in the current warhead model case segment 515 one at a time. The fragment loop (marked in FIG. 1 with arrow line 101, and shown particularly in FIG. 4) iterates until all of the fragments within a warhead model case segment have been evaluated, i.e., the fragment loop iterates, for each warhead model case segment, the warhead model case segment's 515 "fragment count" number of times.

With reference to the fragment loop of FIG. 4, and the fragment loop indicated by line 101 in FIG. 1, for each fragment in the current warhead model case segment 515, embodiments of the invention include instructions for causing a computer to retrieve/recall from computer memory the setup distributions stored in computer memory and the basic fragment performance data (found in blocks 250, 260, 270, 280, 290, 300, and 310 in FIG. 2B) (block 161 in FIG. 4) (referred to in this specification, including the claims as "setup distributions retrieval instructions").

For each fragment in the current warhead model case segment 515 in FIG. 5A, and for each setup distribution, a random number generator generates a value that represents (or is used to compute a value that represents) the characteristic the distribution is used to determine (for example, the fragment weight distribution is used to determine a fragment's weight, the fragment velocity distribution is used to determine a fragment's velocity, and the fragment ejection angle distribution is used to determine a fragment's ejection angle) based on the setup distribution. Embodiments of the invention include instructions for causing a computer to generate a weight, a velocity, and an ejection angle for each fragment in the current warhead model case segment 515 (referred to in this specification, including the claims as "working value generating instructions"), by: 1) initializing (causing to run) a random number generator paramaterized on a version of the setup weight distribution (block 409 in FIG. 4) to generate a value that represents (or is used to compute) the fragment's assigned weight (block 410); 2) initializing a random number generator parameterized on a version of the setup velocity distribution (block 411) to generate a value that represents (or is used to compute) the fragment's assigned velocity (block 415); and 3) initializing a random number generator parameterized on a version of the setup ejection angle distribution (block 413) to generate a value that represents (or is used to determine) the fragment's assigned ejection angle (420).

In one embodiment, the setup distributions stored in computer memory and the basic fragment performance data are used to map, using any known method, a uniformly distributed random number r having range $0 \leq r \leq 1$ into a variable t having range $0 \leq t \leq 1$ where occurrences of t are distributed based on the density function $f(\beta)$, where $f(\beta)$ represents the density function describing the setup fragment weight distribution, fragment velocity distribution, and fragment ejection angle distribution.

For each setup distribution, given the discrete density function $z=f(\beta)$, for $\beta_0 \leq \beta_i \leq \beta_n$ having breakpoints $B_0, B_1, B_2 \ldots B_p$ in the $\beta$ direction, where $\beta_0$ is the minimum of the domain (for fragment velocity, 0; for fragment weight, 0; for fragment ejection angle, $-2(\gamma_t)$), $\beta_n$ is the maximum of the domain (for fragment velocity, $\sqrt{2}G_C$; for fragment weight, $m_{max}$; for fragment ejection angle, $2(\gamma_t)$), The working value generating instructions include instructions for causing a computer to transform the density function z into a normalized and unscaled, i.e., scaled from [0,1], density function ($z'=f(t)$), and implement a random number generator having the characteristics of the normalized and unscaled density function ($z'$). The mapping variable, t, is a normalized unscaled, i.e., scaled from [0,1], version of $\beta$. Note that the $\beta_i$ are taken to be equally spaced at distance $\Delta\beta$.

The function $t=h(r)$ is a monotonically increasing mapping function made up of line segments having a slope given by the method described below that maps the variable r to the variable t. If r is chosen using a uniform random number generator then the mapping variable t will be a random number distributed according to the normalized and unscaled, i.e., scaled from [0,1], density function. That is, the uniform density function will be mapped into the normalized and unscaled, i.e., domain range [0,1], density function, $z'=f(t)$.

In all cases, the value of a variable $\beta$ over the interval $\beta_{k-1} < \beta \leq \beta_k$ is $\beta_{k-1}$ as a left-hand limit.

In one embodiment, for each setup distribution, the working value generating instructions include instructions for causing a computer to scale the setup distribution by translating the interval/range of $\beta_i$ to [0,1]. This is done by mapping $\beta \rightarrow t$, ($\beta_0 \leq \beta_i \leq \beta_n \rightarrow t_0 \leq t_i \leq t_n$), using the scaling relation:

$$t_i = \frac{(\beta_i - \beta_0)}{(\beta_n - \beta_0)} \text{ where } 0 \leq i \leq n, \quad t_0 = 0.0, t_n = 1.0 \quad (17)$$

where $0 \leq i \leq n$, $t_0=0.0$, $t_n=1.0$ (17)

The scaled breakpoints in the t domain are:

$$T_k = \frac{(B_k - B_0)}{(B_p - B_0)} \text{ where } 0 \leq k \leq p, \quad T_0 = 0.0, T_p = 1.0 \quad (18)$$

where $0 \leq k \leq p$, $t_0=0.0$, $T_p=1.0$ (18)

For each density function describing a desired distribution (the fragment weight distribution, fragment velocity distribution, and fragment ejection angle distribution), the area contained by the density function is:

$$A = \sum_{i=1}^{n} z_i(\beta_i - \beta_{i-1}) = \sum_{k=1}^{p} Z_k(B_k - B_{k-1}), \text{ with } z_0 = z_1 \text{ and } Z_0 = Z_1 \quad (19)$$

with $z_0=z_1$ and $Z_0=Z_1$ (19)

where: $z_i$ is the value of z over the interval $z_{i-1} < z \leq z_i$, $Z_k$ is the value of z over the interval $Z_{k-1} < z \leq Z_k$ consistant with the definition of the breakpoints $Z_k$ as the left-hand limit described above.

From Equation 19, the working value generating instructions include instructions for causing a computer to compute the area contained by the unscaled density function:

$$\tilde{A} = \sum_{i=1}^{n} z_i(t_i - t_{i-1}) = \sum_{k=1}^{p} Z_k(T_k - T_{k-1}), \text{ with } z_0 = z_1 \text{ and } Z_0 = Z_1 \quad (20)$$

with $z_0=z_1$ and $Z_0=Z_1$ (20)

where $t_0=T_0=0$ and $t_n=T_p=1$ and $T_k$ is the value of t over the interval $T_{k-1} < t \leq T_k$ as a left-hand limit.

The working value generating instructions include instructions for causing a computer to normalize the density function $z=f(\beta)$ to produce a distribution that is described by a density function having an under curve area of 1. The instructions cause the computer to normalize the density function using Equation 21.

$$\overline{A} = 1 = \frac{\tilde{A}}{\tilde{A}} = \frac{1}{\tilde{A}}\sum_{i=1}^{n} z_i(t_i - t_{i-1}) = \sum_{i=1}^{n}\left(\frac{z_i}{\tilde{A}}\right)(t_i - t_{i-1}) = \sum_{i=1}^{n} \tilde{z}_i(t_i - t_{i-1}) \quad (21)$$

letting $\tilde{z}_0 = \tilde{z}_1$
or in terms of the breakpoints $$\overline{A} = \sum_{k=1}^{p}\left(\frac{Z_k}{\tilde{A}}\right)(T_k - T_{k-1}) = \sum_{k=1}^{p} \tilde{Z}_k(T_k - T_{k-1}), \text{ where} \quad (22)$$

where (22)

$$\tilde{Z}_k = \frac{Z_k}{\tilde{A}},$$

$1 \leq k \leq p$,
$Z_0 = Z_1$,
$\tilde{Z}_0 = \tilde{Z}_1$, and
$\tilde{z}_i$ is the scaled z value.

The resulting function in t and $\tilde{z}_i$ (Equation 21) is (a discrete version of) the density function used to parameterize the random number generator. The scaled variable $\tilde{z}_i$ is also the slope of the mapping line segments in t|r space, so $r_0=t_0=0.0$ and $r_n=t_n=1.0$ must map all of the space. The values of the breakpoints in r space are $(R_0, R_1, \ldots, R_p)$. The working value generating instructions cause the computer to determine the breakpoints in r space using Equation 24.

$$R_k = \tilde{Z}_k(T_k - T_{k-1}) + R_{k-1} \text{ where } R_0 = 0.0 \text{ and } 1 \leq k \leq p \quad (23)$$

Each line segment of h(r) spans adjacent breakpoints in the collection $(R_0, R_1, \ldots, R_p) | (T_0, T_1, \ldots, T_p)$ each having the form:

$$t = m_k r + b_{k-1} \text{ over the range } R_{k-1} < r \leq R_k \text{ which maps} \tag{24}$$
$$\text{into } T_{k-1} < t \leq T_k \text{ for } 1 \leq k \leq p$$

So:

$$m_k = \frac{1}{\tilde{Z}_k} = \frac{\tilde{A}}{Z_k} = \frac{(T_k - T_{k-1})}{(R_k - R_{k-1})}, \tag{25}$$

and:

$$b_k = (T_k - m_k R_k) = (T_{k-1} - m_k R_{k-1}) \tag{26}$$

where $b_1 = 0$ and:

$$t = m_k(r - R_k) + T_k = \left(\frac{\tilde{A}}{Z_k}\right)(r - R_k) + T_k \text{ for } R_{k-1} < r \leq R_k \tag{27}$$

for $R_{k-1} < r \leq R_k$ (27)

and:

$$t = m_k(r - R_{k-1}) + T_{k-1} \tag{28}$$

In other words, for each density function describing a desired distribution (the fragment weight distribution, fragment velocity distribution, and fragment ejection angle distribution), given the vectors Z and B corresponding to the input density function $f(\beta)$, the working value generating instructions include instructions for causing a computer to:
1. Set $T_0 = 0.0$, $R_0 = 0.0$, $Z_0 = Z_1$;
2. Compute the vector T from the vector B using Equation 18;
3. Compute the scalar $\tilde{A}$ from the vectors Z and T using Equation 19;
4. Compute the vector $\tilde{Z}$ from the vector Z and the scalar $\tilde{A}$ using Equation 22;
5. Set $\tilde{Z}_0 = \tilde{Z}_1$;
6. Compute the vector R from the vectors $\tilde{Z}$, and T using Equation 23;
7. Compute the vector m from the vector $\tilde{Z}$ using Equation 24;
8. Set $m_0 = m_1$;
9. Set up an index array to hash into the distribution array corresponding to the vector R;
10. Construct the transform $t_{out} = \psi[r, f(\beta)]$ that maps a random number r having range $0 \leq r \leq 1$ into a variable t (the distribution of t being described by a density function with an under area curve of 1 and a range of $0 \leq t \leq 1$), where occurrences of t are distributed based on the density function $z = f(\beta)$.

The instructions cause the computer to implement the transformation by mapping the domain defined by r into a range divided into p segments. Each segment in the range corresponds to a linear mapping function defined by Equation 27 or Equation 28. Given the value r from the uniformly distributed random number generator, in one embodiment, the working value generating instructions include instructions for causing a computer to implement steps 9 and 10 on pages 45 and 46 of this specification using the following procedure:

a) Setup an array that indexes into the distribution array R(k) by intervals of 0.1:

```
int indexArray[11];
indexArray[0]=0;
for(d=0.1, k=-1, i=1; i<11; i++)
{
while(k<p&&R[k]<=d) k++;
indexArray[i]=k;
d+=0.1;
}
``` b) Hash to the index into the distribution array:
for(k=indexArray[(int)(10.0*r)];r>R[k];k++);
c) Compute the transformed value of random variable r.
tout=m[k]*(r-R[k])+T[k];.
This works for the unevenly spaced intervals defined by the $R_k$ so given k, then:

$$t_{out} = m_k(r - R_k) + T_k \tag{29}$$

for $R_{k-1} < r \leq R_k$, and $1 \leq k \leq p$.

The working value generating instructions include instructions for causing a computer to transform the output variable, $t_{out}$, back into the original domain (for weight: 0 to $m_{max}$; for velocity: 0 to $\sqrt{2}G_C$; for ejection angle: $-2(\gamma_t)$ to $2(\gamma_t)$), producing a "working value", $W_{frag}$, for each characteristic of the current fragment (the working value fragment weight, $W_{frag_{weight}}$, working value fragment velocity, $W_{frag_{velocity}}$, and working value fragment ejection angle, $W_{frag_{ejection}}$) using:

$$W_{frag} = (\beta_n - \beta_0) t_{out} + \beta_0 \tag{30}$$

Within the fragment loop, for each fragment, embodiments of the invention include "correlation instructions" used to execute a "correlation loop" programmed to operate within the fragment loop; the "correlation instructions" include instructions for causing a computer to analyze at least two of the working values ($W_{frag}$) and to loop/iterate through the correlation loop (409, 411, 413, 410, 415, and 420 in FIG. 4) until it is established that a pre-determined correlation (step 105) between at least two of the working values ($W_{frag}$) exists, i.e., until exit conditions are met. A fragment's working values $W_{frag}$ that have been determined to be correlated comprise the "fragment performance profile". Note that a fragment's "fragment performance profile" may be updated/changed if end fragments are generated.

In one embodiment, a pre-determined correlation between at least two of the working values ($W_{frag}$) can be:
1) a correlation between fragment velocity and fragment ejection angle, or
2) a correlation between fragment weight and fragment ejection angle.

In this embodiment, the pre-determined correlations between fragment velocity and fragment ejection angle, and fragment weight and fragment ejection angle are based on the following principles:
1) fragments traveling at a higher velocity correlate with higher fragment ejection angles;
2) lighter fragments tend to be ejected away from the calculated ejection angle.

In this embodiment, a pre-determined correlation between at least two of the working values ($W_{frag}$) exists (exit conditions are met) when the ejection angle random deviate is greater than the velocity random deviate taken to the $C_v$ power and/or the ejection angle is less than the fragment weight random deviate taken to the $C_w$ power. In this embodiment, the correlation instructions include instructions for causing a computer to (note that 1 and 2 immediately following can be performed in either order):
1) retrieve/recall the ejection angle random deviate and the velocity random deviate, compute the velocity random deviate taken to the $C_v$ power, compare the ejection angle random deviate to the velocity random deviate taken to the $C_v$ power; and a) when the ejection angle random deviate is greater than the velocity random deviate taken to the $C_v$ power (thereby meeting exit conditions), exit the correlation loop into step 430;

b) when the ejection angle random deviate is not greater than the velocity random deviate taken to the $C_v$ power, and i) when it has been determined that the ejection angle random deviate is not less than the fragment weight random deviate taken to the $C_w$ power, instruct the computer to perform an additional iteration of the fragment loop;

ii) when it has not been determined that the ejection angle random deviate is not less than the fragment weight random deviate taken to the $C_w$ power, instruct the computer to proceed to 2;

2) retrieve/recall the ejection angle random deviate and the velocity random deviate, compute the fragment weight random deviate taken to the $C_w$ power, compare the ejection angle random deviate and the fragment weight random deviate taken to the $C_w$ power, and a) when the ejection angle random deviate is less than the fragment weight random deviate taken to the $C_w$ power (thereby meeting exit conditions), exit the correlation loop into step 430;

b) when the ejection angle random deviate is not less than the fragment weight random deviate taken to the $C_w$ power, and i) when it has been determined that the ejection angle random deviate is not greater than the fragment velocity random deviate taken to the $C_v$ power, instruct the computer to perform an additional iteration of the fragment loop;

ii) when it has not been determined that the ejection angle random deviate is not greater than the fragment weight random deviate taken to the $C_v$ power, instruct the computer to proceed to 1.

The variables $C_v$ and $C_w$ are the correlation parameters and are read from the parameters file. When the current iteration's working values ($W_{frag}$) meet the correlation parameters, exit conditions are met, and the loop is exited into step 430.

Embodiments of the invention include "roll angle generating instructions" for causing a computer to generate a roll angle (FIG. 5B) for the current fragment as a uniformly distributed random value between 0 and 360 degrees (step 430).

With reference to FIGS. 6A and 68 (and generally represented by block 166 in FIG. 4), working value fragment ejection angle converting instructions include instructions for causing a computer to convert the working value fragment ejection angle ($W_{frag_{ejection}}$) to external coordinates 166 in FIG. 6B and FIG. 1B, thereby generating what is referred to in this specification including the claims as a "polar working value fragment ejection angle" ($W_{frag_{ejection\,polar}}$) (813 in FIG. 6A). The instructions cause a computer to generate $W_{frag_{ejection\,polar}}$ by causing a computer to:

1) compute the case polar angle, $\alpha$, from the known fragment case coordinates using Equation 32 (step 605 in FIG. 6B):

$$\tan(\alpha)=y_c/x_c, \text{ where} \qquad (31)$$

$x_c$=fragment case ejection x position relative to the field origin, and $y_c$=fragment case ejection y position relative to the field origin;

2) compute the internal case polar radius from the fragment case coordinates using Equation 32 (step 610):

$$r=(x_c^2+y_c^2)^{1/2}, \text{ where} \qquad (32)$$

$x_c$=fragment case ejection x position relative to the field origin, and $y_c$=fragment case ejection y position relative to the field origin;

3) compute the distance from the fragment case coordinates to the fragment field coordinates using Equation 33 (step 615):

$$s=(R^2-r^2*\sin^2(\alpha-W_{frag_{ejection}}))^{1/2}-r\times\cos(\alpha-W_{frag_{ejection}}) \qquad (33)$$

where

R is the fragment field radius, r is the internal case polar radius and was calculated in step 610, $\alpha$ is the fragment case polar angle and was calculated in step 605, and $W_{frag_{ejection}}$ is the working value fragment ejection angle, calculated as in step 420 in FIG. 4.

4) compute the fragment field coordinates relative to the field origin using Equations 34 and 35 (step 620 in FIG. 6B):

$$x_f=x_c-s*\cos(W_{frag_{ejection}}), \text{ where} \qquad (34)$$

$x_c$=fragment case ejection x position relative to the field origin, s is the distance from the fragment case coordinates to the fragment field coordinates and was computed in step 615, and $W_{frag_{ejection}}$ is the working value fragment ejection angle, calculated as in step 420 in FIG. 4

$$y_f=y_c-s*\sin(W_{frag_{ejection}}), \text{ where} \qquad (35)$$

$y_c$=fragment case ejection y position relative to the field origin, s is the distance from the fragment case coordinates to the fragment field coordinates and was computed in step 615 in FIG. 6B, and $W_{frag_{ejection}}$ is the working value fragment ejection angle, calculated as in step 420 in FIG. 4;

5) compute the polar working value fragment ejection angle, $W_{frag_{ejection\,polar}}$, using Equation 36 (step 625 in FIG. 6B):

$$\tan(W_{frag_{ejection\,polar}})=y_f/x_f, \text{ where} \qquad (36)$$

$y_f$ and $x_f$ are the fragment field coordinates relative to the field origin and were computed in step 620.

Figure 7B:
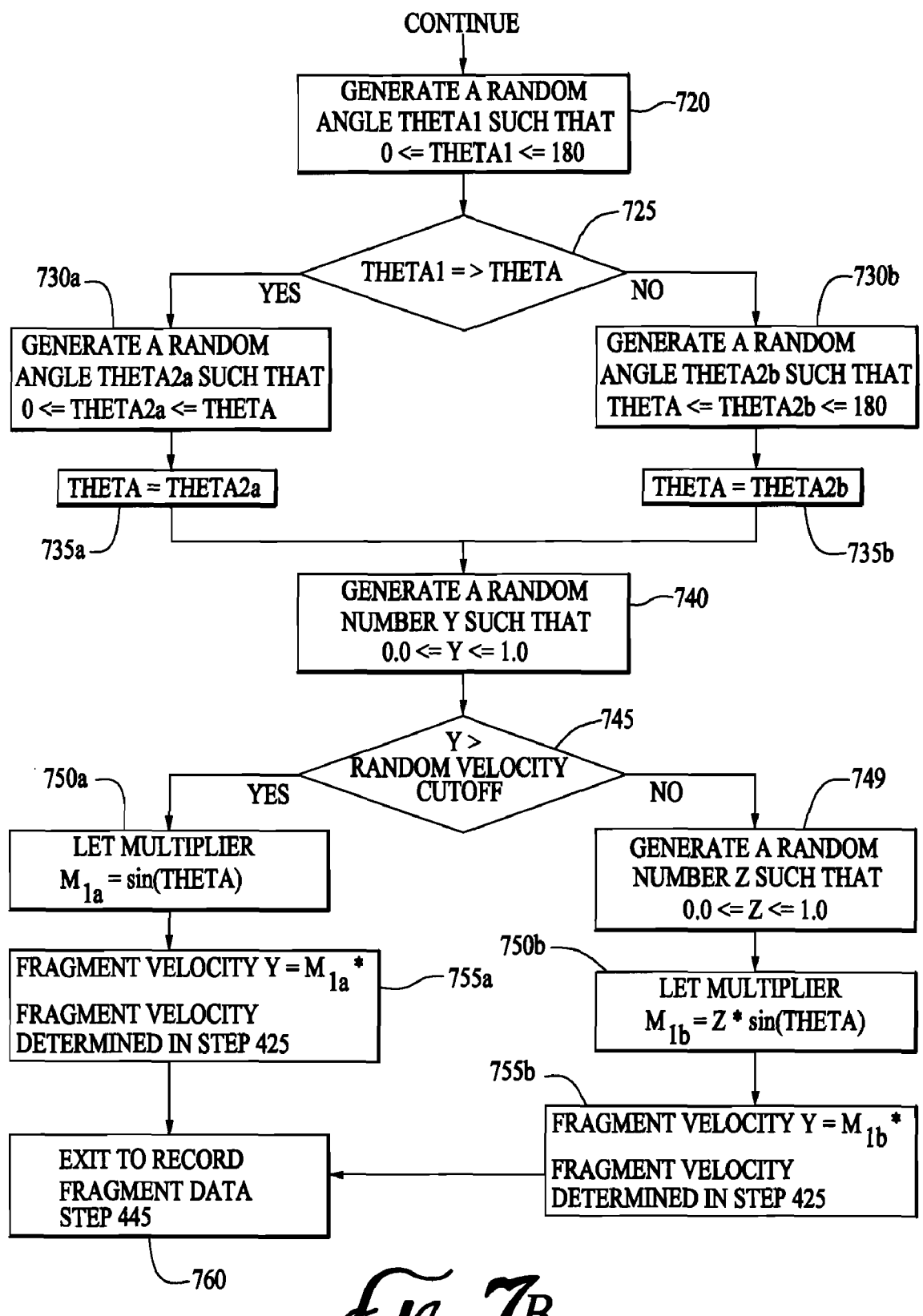

One embodiment of the invention includes end fragment generating instructions for causing a computer to generate end fragments (end fragments are fragments outside the main beamspray, where the beamspray is defined to be fragments generated between polar angles 45 to 135 degrees from the nose, directed toward the nose and the tail of the warhead) (referred to in this specification, including the claims, as "end fragment generating instructions"). In embodiments where end fragments are to be generated, the "fragment loop" includes step 167 in FIGS. 1B and 4. Beginning with step 167, FIGS. 7A and 7B illustrate a flow chart of end fragment generating instructions according to an embodiment of the invention. In one embodiment where end fragments are to be generated, the end fragment generating instructions are activated from the command line and use user controlled parameters as well as default parameters. The end fragment generating instructions, in effect, cause a computer to randomly move selected fragments from the beamspray region to outside the main beamspray region.

For example, in one embodiment, end fragment generating instructions include instructions for accepting as input a user assigned/selected value of a variable/parameter referred to as an "End Fragment Factor", which is a random number between 0 and 1.0. One possible default value that can be assigned to the End Fragment Factor is 0.90. In this embodiment, the end fragment generating instructions also include instructions for accepting as input a user assigned/selected variable/parameter referred to as a "Random Velocity Cutoff", which is a random number between 0 and 1.0. In this embodiment, one possible default value that may be assigned to the Random Velocity Cutoff is 0.98. In this embodiment, a subroutine is performed that uses as input a generated polar working value fragment ejection angle $W_{frag_{ejection\,polar}}$ (note that although $W_{frag_{ejection\,polar}}$ is referred to as the generated polar working value fragment ejection angle, $W_{frag_{ejection\,polar}}$ may be changed/updated if a random number between 0 and 1.0 (X) is greater than a generated random number greater than or equal to the End Fragment Factor and less than or equal to 1.0 (D), as can be seen in FIG. 7B, steps 735(a, b)). The subroutine includes instructions for causing a computer to generate a random number greater than or equal to the End Fragment Factor and less than or equal to 1.0 (D) (step 700 in FIG. 7A) and a random number between 0 and 1.0 (X) (step 705). The subroutine includes instructions for causing a computer to compare X to D (step 710). When X is less than or equal to D, then the fragment is not considered to be an end fragment. The subroutine includes instructions for causing a computer to exit (step 715) the subroutine to step 445 in FIG. 4 when the fragment is not considered to be an end fragment. When the generated random number between 0 and 1.0 (X) is greater than the generated random number greater than or equal to the End Fragment Factor and less than or equal to 1.0 (D), the fragment is considered an end fragment.

The subroutine includes instructions for causing a computer to do the following when the fragment is considered to be an end fragment:
1) generate a random angle greater than or equal to 0 and less than or equal to 180 (step 720) Theta1 ($\theta_1$);
2) compare Theta1 ($\theta_1$) to $W_{frag_{ejection\,polar}}$ (step 725 in FIG. 7B) and, depending upon the comparison, generate and update the value of $W_{frag_{ejection\,polar}}$ as follows:
   a) When Theta1 ($\theta_1$) is greater than or equal to $W_{frag_{ejection\,polar}}$,
      i) generate a random angle Theta2a ($\theta_{2a}$) such that Theta2a ($\theta_{2a}$) is greater than or equal to 0 and less than or equal to $W_{frag_{ejection\,polar}}$ (step 730a);
      ii) update the value of $W_{frag_{ejection\,polar}}$ (although there is a small chance the value of $W_{frag_{ejection\,polar}}$ will not be changed from its originally determined value as described in FIG. 7) to be = to Theta2a ($\theta_{2a}$) (step 735a), making the end fragment a forward moving end fragment.
   b) When Theta1 ($\theta_1$) is less than $W_{frag_{ejection\,polar}}$,
      i) generate a random angle Theta2b ($\theta_{2b}$) such that Theta2b ($\theta_{2b}$) is greater than or equal to $W_{frag_{ejection\,polar}}$ and less than or equal to 180 (step 730b).
      ii) update the value of $W_{frag_{ejection\,polar}}$ (there is a small chance the value of $W_{frag_{ejection\,polar}}$ will not be changed from its originally determined value) to be = to Theta2b ($\theta_{2b}$) (step 735b), making the end fragment a backward moving end fragment.
3) generate a random number that is greater than or equal to 0 and less than or equal to 1 (Y) (step 740);
4) compare Y to the Random Velocity Cutoff (step 745) and, based on the comparison, generate a multiplier and update the working value fragment velocity $W_{frag_{velocity}}$ (generated in step 415 in FIG. 4) as follows:
   a) when Y is greater than the Random Velocity Cutoff,
      i) generate a multiplier, $m_{1a}$, that is equal to the $\sin(W_{frag_{ejection\,polar}})$ (step 750a in FIG. 7B);
      ii) multiply $m_{1a}$ and the working value fragment velocity $W_{frag_{velocity}}$ as determined in step 415 in FIG. 4;
      iii) update $W_{frag_{velocity}}$ such that $W_{frag_{velocity}}$ is equal to $m_{1a}$ multiplied by the working value fragment velocity $W_{frag_{velocity}}$ as determined in step 415 (step 755a in FIG. 7B), yielding an updated $W_{frag_{velocity}}$;
   b) when Y is not greater than the Random Velocity Cutoff,
      i) generate a random number Z such that Z is greater than or equal to 0 and less than or equal to 1 (step 749);
      ii) generate a multiplier, $m_{1b}$, such that $m_{1b}$ is equal to $Z*\sin(W_{frag_{ejection\,polar}})$ (step 750b);
      iii) multiply $m_{1b}$ and the working value fragment velocity $W_{frag_{velocity}}$ as determined in step 415 in FIG. 4;
      iv) update $W_{frag_{velocity}}$ such that $W_{frag_{velocity}}$ is equal to $m_{1b}$ multiplied by the working value fragment velocity $W_{frag_{velocity}}$ as determined in step 415 (step 755b in FIG. 7B), yielding an updated $W_{frag_{velocity}}$;
5) exit (step 760) into step 445 in FIG. 4.

When end fragments are to be generated, the resulting/yielded updated/changed working values $W_{frag}$ comprise the fragment's "fragment performance profile".

A plurality of fragment performance data structures is configured to store fragment performance data (including the fragment performance profile) for each of the fragments in the current warhead model case segment 515 in FIG. 5 (step 445 in FIG. 4). Block 445 represents instructions for causing a computer to store, in the plurality of fragment performance data structures, the fragment's fragment performance profile, i.e., the fragment weight generated in step 410, the fragment velocity generated in step 415 (and, if applicable, the fragment velocity calculated in step 755a or b in FIG. 7B), and the fragment ejection angle generated in step 420 in FIG. 4 (and, if applicable, the fragment velocity calculated in step 755a or b in FIG. 7B).

Some embodiments include "field filters instructions" which include instructions for causing a computer to apply a set of field parameters/filters to the data elements that comprise the fragment performance data structures (block 169 in FIG. 1B). The field parameters/filters are derived from empirical data collected from tests performed for similar types of warheads. The parameters file includes "field" filters, which are used to tailor models to test conditions in the field, and model distribution parameters, which characterize the three fragment distributions and two correlations. The set of field filters is comprised of empirical data obtained from arena warhead tests that have been performed for similar warheads. The results of applying the field parameters/filters to the data elements within the fragment performance data structures are stored as a field performance record (block 350 in FIG. 3).

Warhead performance can be tabulated (or visually depicted) as average fragmentation characteristics calculated over designated angular bins (having a pre-determined angular coverage, for example, 5 degree increments) called polar zones. Some embodiments of the invention include instructions for causing a computer to assign fragmentation characteristics to a polar zone (block 345) (referred to in this specification, including the claims, as "polar zone accumulating instructions"), i.e., accumulate fragment performance per polar zone by assigning fragment data contained within the fragment performance data structures to a polar zone. The accumulated fragment performance per polar zone data is stored in the fragment performance data structures.

Embodiments of the invention include instructions for causing a computer to decrement the fragment count (block 355) for the current warhead model case segment, 515 in FIG. 5A, after each fragment in the current warhead model case segment 515 is processed. Embodiments of the invention include instructions for causing a computer to determine whether all fragments in the current warhead model case segment 515 have been processed (step 360), (the decremented fragment count (block 355)=0). Embodiments of the invention include instructions for instructing the computer to process then next fragment in the current warhead model case segment, 515 in FIG. 5A, when the decremented fragment count (block 355)>0 (meaning that all fragments in the current warhead model case segment have not been processed). Embodiments of the invention include instructions for causing a computer to decrement the segment count (block 336) each time the decremented fragment count (block 355)=0 (meaning that all fragments in a current warhead model case segment, 515 in FIG. 5A, have been processed).

Embodiments of the invention include instructions for causing the computer to determine whether all warhead model case segments 515 in the warhead have been processed (as determined in step 319); all warhead model case segments, 515 in FIG. 5A, in the warhead 510 have been processed when the decremented segment count (step 336)=0. Embodiments of the invention include instructions for instructing the computer to process the next warhead model case segment, 515 in FIG. 5A, in the warhead 510 when the decremented warhead model case segment>0 (meaning that all warhead model case segments 515 in the warhead 510 have not been processed) (as shown in step 319 in FIG. 3 in FIG. 3).

Embodiments of the invention include instructions for causing the computer to determine whether all Monte Carlo iterations have been run (steps 180 in FIGS. 1C and 9A and 179 in FIG. 1C).

When only one iteration is to be performed, i.e., the initial Monte Carlo iteration run count is not >1 (step 179), and all warhead model case segments, 515 in FIG. 5A, have been processed, i.e., the decremented segment count (step 336 in FIG. 3)=0 as determined in step 319 in FIG. 3, instructions included in the embodiment cause the computer to generate information/data files based on information/data of the "final run" in the fragment performance data structures. (Note that if only one Monte Carlo iteration is to be performed, the "final run" (referred to in block 184 in FIGS. 1C and 9B) is the single Monte Carlo iteration.))

When multiple Monte Carlo iterations are to be performed (as input in step 205 in FIG. 2A) (determined in step 179 in FIG. 9A), and another Monte Carlo iteration remains to be performed (step 180 in FIGS. 1C and 9A), embodiments include instructions for causing the computer to save the data from the current Monte Carlo iteration data in computer memory (fragment performance data structures) using any known device and/or manner that will allow the computer to later distinguish between data from different Monte Carlo iterations (block 930 in FIG. 9A), re-seed the random numbers generators (as shown in 104 in FIG. 1), and analyze the warhead again, i.e., the segment loop (FIG. 3, and indicated by line 102 in FIG. 1), fragment loop (FIG. 4, and indicated by line 101 in FIG. 1), and correlation loop (indicated by line 105 in FIG. 1), are run with re-seeded random number generators. When all Monte Carlo iterations have been executed (as determined in step 180 in FIG. 1C), embodiments include "iteration averaging instructions" for causing a computer to average the Monte Carlo iterations and store the average in computer memory (step 952 in FIG. 9B). Some embodiments of the invention include "best fit" instructions for causing a computer to retrieve the average and individual Monte Carl runs, compare the individual Monte Carlo runs to the average, and identify the Monte Carlo iteration that best fits the average performance (block 954). Embodiments of the invention include "final run designating" instructions for causing a computer to designate the "best fit" Monte Carlo iteration as the "final run" (block 956).

Some embodiments of the invention include instructions for causing a computer to analyze the "final run" (block 184) (again, when only a single run/iteration was to be performed, the "final run" is the single iteration) ("analyzing instructions"). Embodiments of the invention include "analyzing instructions" for causing a computer to generate post process information files from the data in the "final run" (step 958). The information files include a detailed warhead model case segment data file (958a), a summary warhead model case segment performance data file (958b), and a summary warhead model case segment performance by polar zone data file (958c). The summary warhead model case segment performance by polar zone data file is generated using information in the fragment performance data structures. Embodiments of the invention include instructions for causing a computer to retrieve/recall information in the fragment performance data structures and calculate average fragment characteristics, including, but not limited to, $W_{frag_{velocity}}$ and $W_{frag_{weight}}$ (computed in steps 410 and 415 in FIG. 4—or where applicable, i.e., when updated using the end fragment generating instructions, in steps 755 a,b in FIG. 7B) per a pre-determined polar zone based on $W_{frag_{ejection\ polar}}$.

Figure 8A:
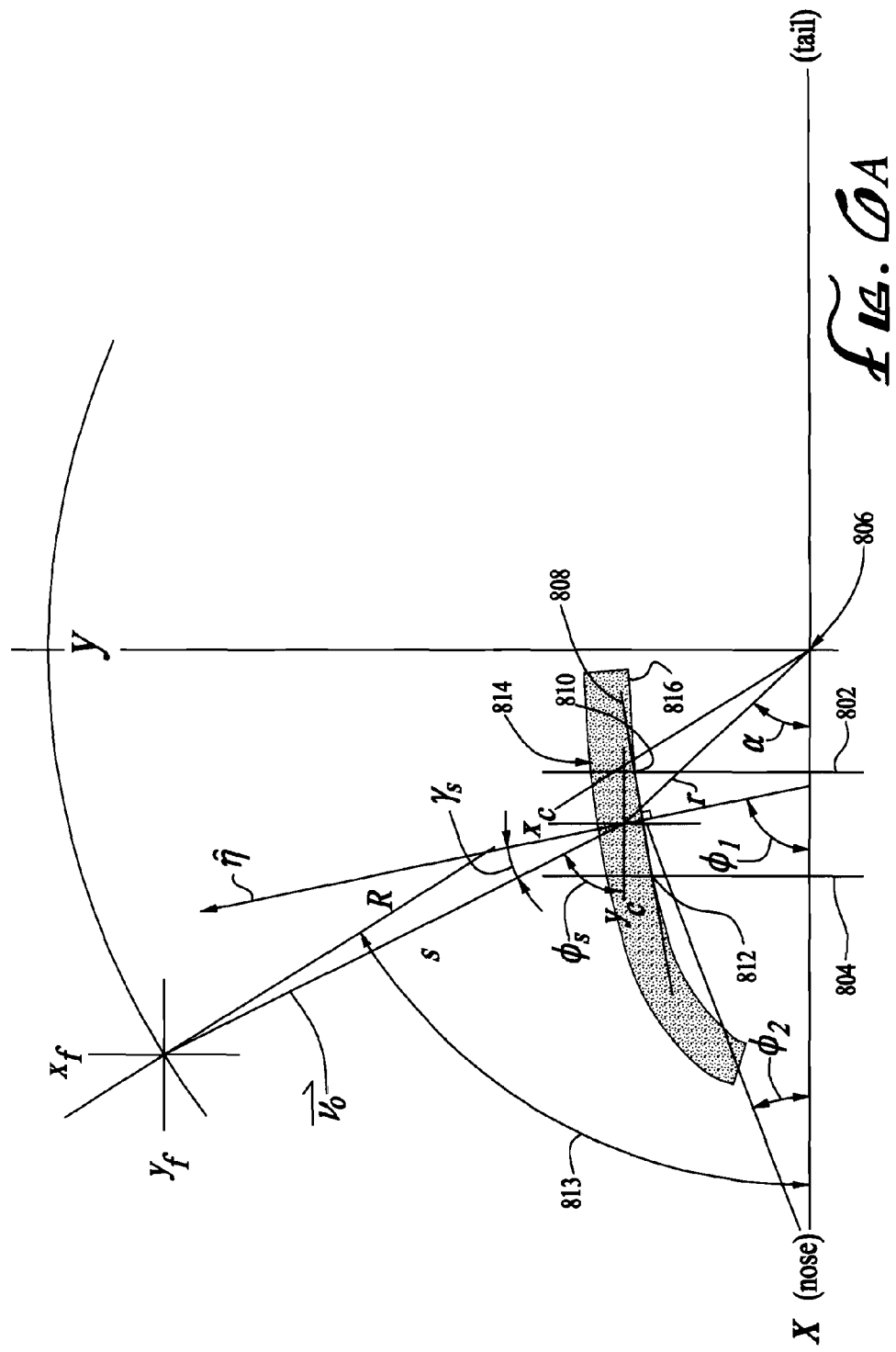
Figure 9B:
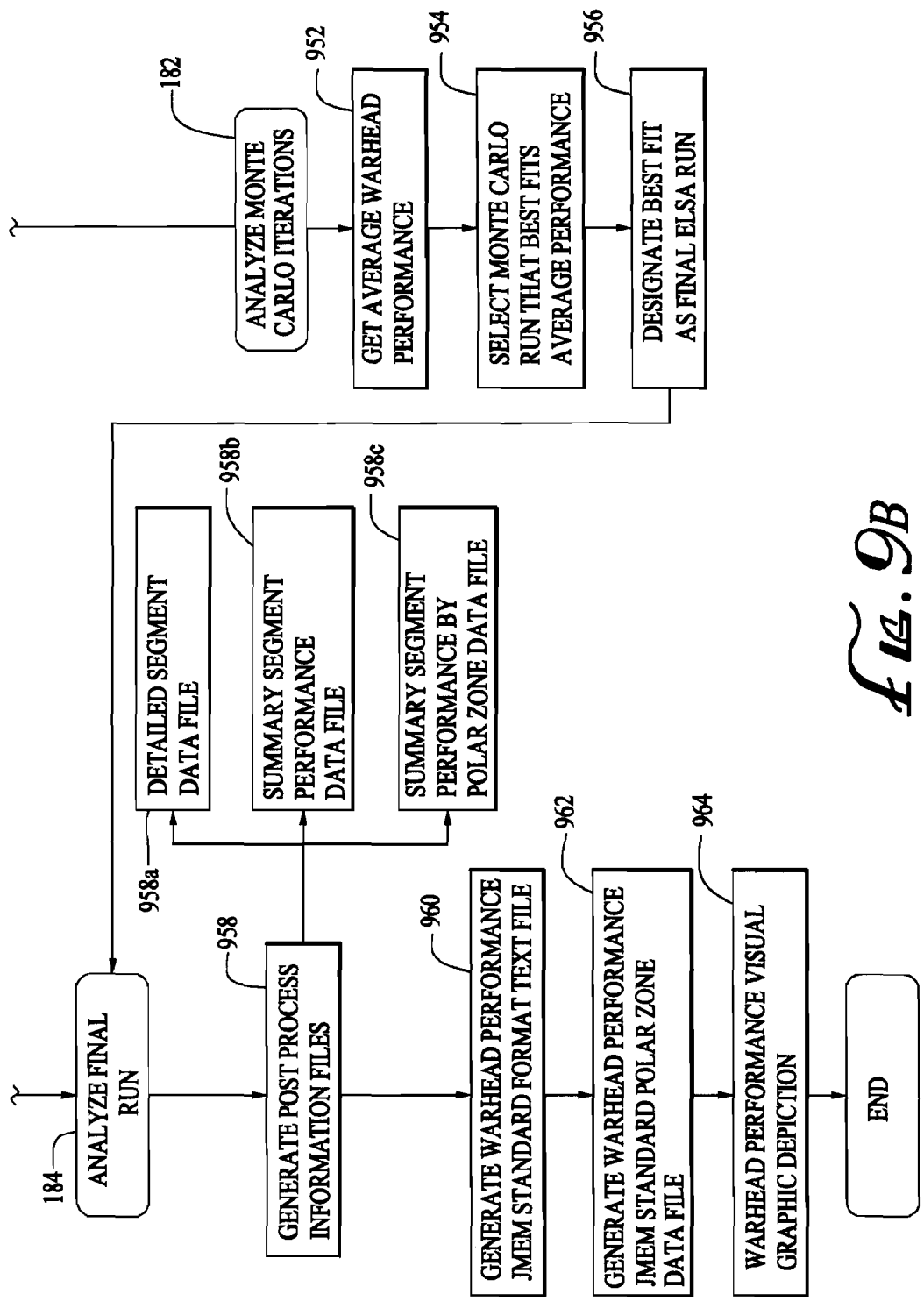
Figure 10:
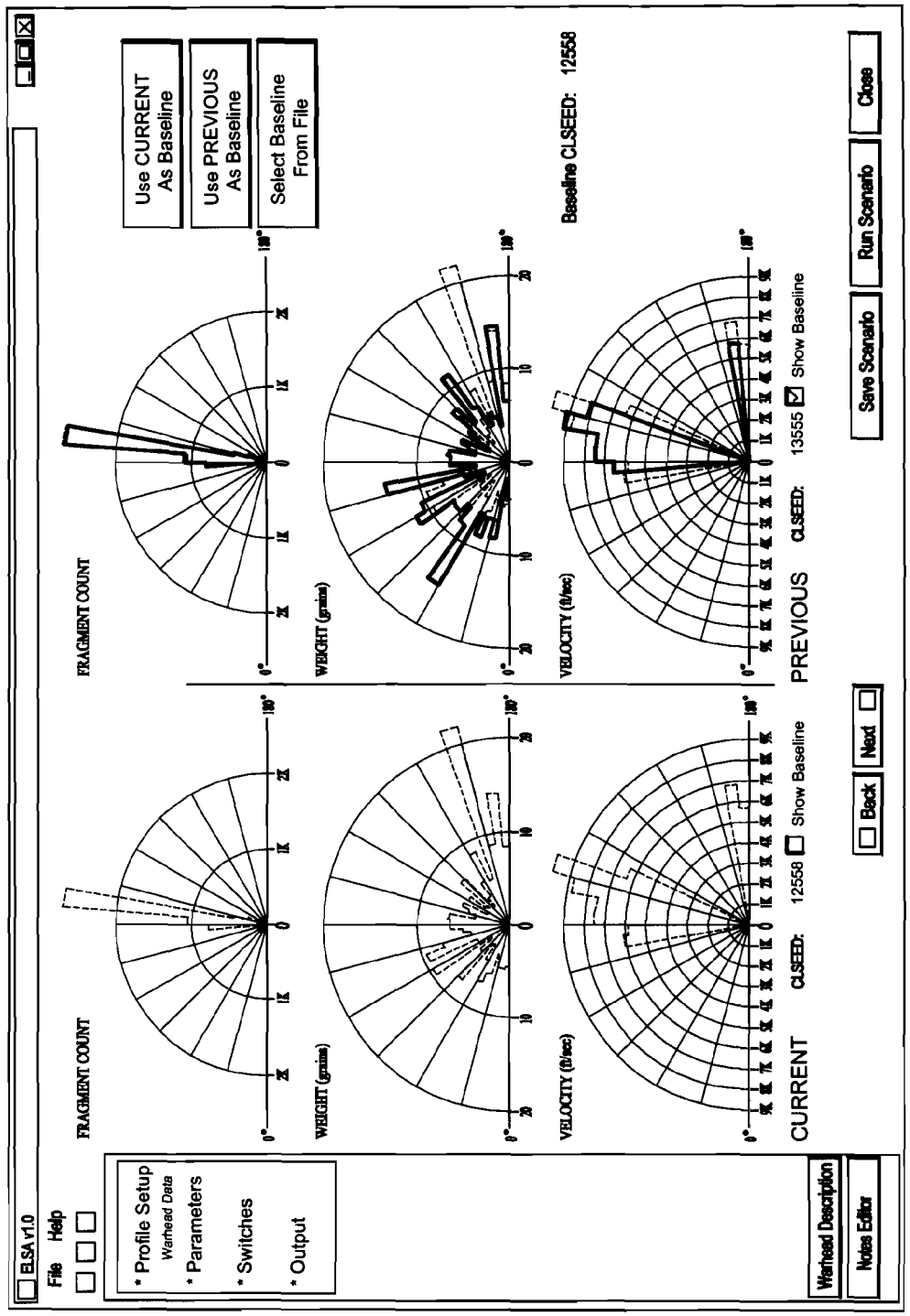
FIG. 10 is a screen shot of one embodiment of the invention; the screen shot includes most of FIGS. 8A-F.

Some embodiments of the invention include instructions for generating text and/or graphics files using the information/data files generated in 958 a-c in FIG. 9B ("user defined format generating instructions"). In another, a user defined format is a standard Joint Munitions Effectiveness Manuals (JMEM) document format file. In another embodiment, a user defined format is a standard JMEM ZDATA format file. Some embodiments include instructions for causing the computer to generate a visual/graphical depiction of the warhead performance on an electronic display. FIGS. 8A, 8C, and 8E illustrate one embodiment of a visual depiction of warhead performance taken from a screen shot (FIG. 10) (modified to comply with USPTO figure requirements) of an electronic display of one embodiment of the invention as implemented to analyze one possible 2.75 inch rocket warhead. Note that the nose of the warhead is on the left of the plot (0 degrees polar angle) while the tail is on the right of the plot (180 degrees polar angle). FIG. 8A shows a partial visual depiction a result of one embodiment of the invention, presented as fragmentation performance polar plot from a run for a 2.75 inch rocket warhead. The plot shows fragment count per polar zone (e.g. 90-95 degrees polar angle, 95-100 degrees polar angle etc. in 5 degree increments). FIG. 8C shows a partial visual depiction of the result of one embodiment of the invention presented as fragmentation performance polar plots from a run for a 2.75 inch rocket warhead. This plot shows the average fragment weight per polar zone. The plot shows the results from the current run, (or Monte Carlo iteration). FIG. 8E shows a partial visual depiction of the result of one embodiment of the invention presented as fragmentation performance polar plots from a run for a 2.75 inch rocket warhead. The plot shows the average fragment velocity per polar zone. The plot shows the result from the current run (or Monte Carlo iteration). FIG. 10 is a screen shot of one embodiment of the invention; the screen shot includes most of FIGS. 8A-F.

What is claimed is:

1. A warhead performance modeling computer program product in a non-transitory computer readable medium having computer readable program code recorded thereon, wherein the computer readable program code includes instructions comprising:

at least one loading instruction for causing a computer to read a parameters file and a warhead file, and store them in the computer's memory, wherein said warhead file provides information indicating the number of warhead model case segments in a warhead;

at least one warhead model setup instruction for causing the computer to set up a warhead model, said warhead model including an average fragment weight per warhead model case segment, an average fragment velocity per warhead model case segment, and an average fragment ejection angle per warhead model case segment;

a plurality of instructions for causing the computer to execute a segment loop, wherein a maximum number of iterations of said segment loop is equal to said number of warhead model case segments in said warhead indicated by information provided in said warhead file;

at least one warhead model retrieval and fragment count instruction programmed to operate within said segment loop for causing the computer to retrieve data included in said warhead model;

at least one distribution setup instruction programmed to operate within said segment loop for causing the computer to set up distributions which comprises a fragment weight distribution, a fragment velocity distribution, and a fragment ejection angle distribution;

a plurality of sets of instructions for executing a fragment loop programmed to operate within said segment loop, wherein a maximum number of iterations of said fragment loop is equal to a number of fragments in said warhead model case segment;

at least one setup distributions retrieval instruction programmed to operate within said fragment loop for causing said computer to retrieve said setup distributions;

at least one working value generating instruction programmed to operate within said fragment loop and controlling a plurality of parameterized random number generators, said working value generating instructions including instructions for causing the computer to:

use each of said retrieved setup distributions to parameterize one of said random number generators based at least in part on one of said retrieved said setup distributions such that each of said random number generators is parameterized at least in part by one of said retrieved setup distributions, initialize at least one of said parameterized random number generators to produce an output, generate a fragment performance profile using said outputs, said fragment performance profile including a working value of fragment weight, a working value of fragment velocity, and a working value of fragment ejection angle for each fragment, store said fragment performance profile in a fragment performance data structure;

at least one correlation instruction for causing a computer to execute a correlation loop programmed to operate within said fragment loop, said correlation loop iterating through said setup distributions retrieval instructions and said working value generating instructions for generating the fragment performance profile using said outputs, until a correlation between a plurality of said working values has been established;

at least one end fragment generating instruction programmed to execute within said fragment loop for causing a computer to generate end fragments, said computer instructions using as input a polar working value of fragment ejection angle, $W_{frag\ ejection\ polar}$, said end fragment generating instructions having computer readable code for causing a computer to generate a first random number D and a second random number X, compare X to D:

when X is less than or equal to D:
exit said end fragment generating instructions;
when X is greater than D:
generate Theta1 ($\theta_1$), a random value greater than or equal to zero (0) and less than or equal to one hundred and eighty (180), compare Theta1 ($\theta_1$) to $W_{frag\ ejection\ polar}$:
when Theta1 ($\theta_i$) is greater than or equal to $W_{frag\ ejection\ polar}$
generate a random angle Theta2a ($\theta_{2a}$),
update and store the value of $W_{frag\ ejection\ polar}$ to be equal to Theta2a ($\theta_{2a}$);
when Theta1 ($\theta_i$) is less than $W_{frag\ ejection\ polar}$,
generate a random angle Theta2b ($\theta_{2b}$),
update and store the value of $W_{frag\ ejection\ polar}$ to be equal to Theta2b ($\theta_{2b}$);
generate a random number Y, compare Y to a Random Velocity Cutoff:
when Y is greater than the Random Velocity Cutoff:
generate a multiplier $m_{1a}$ such that said multiplier is equal to the $\sin(W_{frag\ ejection\ polar})$,
multiply the working value of fragment velocity, ($W_{frag\ velocity}$), for the fragment as determined in said working value generating computer instructions by $m_{1a}$, to generate a first product,
store the first product as said working value fragment velocity, ($W_{frag\ velocity}$) in said fragment performance profile in said fragment performance data structure;
when Y is not greater than the Random Velocity Cutoff:
generate a random number Z, generate a multiplier such that said multiplier ($m_{1b}$) is equal to $Z*\sin(W_{frag\ ejection\ polar})$,
multiply the working value fragment velocity, ($W_{frag\ velocity}$), for the fragment as determined in said working value generating computer instructions by $m_{1b}$, to generate a second product,
store the second product as said working value fragment velocity, ($W_{frag\ velocity}$), in said fragment performance profile in said fragment performance data structure, wherein all instructions above except said loading instructions and said warhead model instructions form a Monte Carl instruction;

at least one instruction for causing the computer to determine whether at least one Monte Carlo instruction remains to be run;

at least one instruction for causing the computer to save data from current Monte Carlo instruction in the computer's memory to distinguish data from different Monte Carlo instruction data, re-seed the random numbers generators, and re-analyze the warhead;

at least one user-defined format generating instruction for causing the computer to process said fragment performance data structure, said processing resulting in a statistically based warhead performance model, wherein said statistically based warhead performance model is used to predict a warhead performance.

2. The warhead performance modeling computer program product of claim 1, wherein said fragment velocity distribution and said fragment ejection angle distribution are based on a version of a beta density function describing a beta distribution.

3. A computer implemented method for modeling warhead performance comprising:

loading on a computer's memory a parameters file and a warhead file, wherein said warhead file provides information indicating the number of warhead model case segments in a warhead;

setting up on the computer, a warhead model, said warhead model including an average fragment weight per warhead model case segment, an average fragment velocity per warhead model case segment, and an average fragment ejection angle per warhead model case segment;

providing a plurality of sets of instructions for causing the computer to execute a segment loop, wherein a maximum number of iterations of said segment loop is equal to said number of warhead model case segments in said warhead indicated by information provided in said warhead file;

providing at least one instruction programmed to operate within said segment loop for causing the computer to retrieve data included in said warhead model;

providing at least one instruction programmed to operate within said segment loop for causing the computer to set up distributions which comprise a fragment weight distribution, a fragment velocity distribution, and a fragment ejection angle distribution, thereby producing setup distributions;

providing at least one instruction for executing a fragment loop programmed to operate within said segment loop, wherein a maximum number of iterations of said fragment loop is equal to a number of fragments in said warhead model case segment;

providing at least one instruction programmed to operate within said fragment loop for causing said computer to retrieve said setup distributions;

providing at least one instruction programmed to operate within said fragment loop and controlling a plurality of parameterized random number generators including instructions for causing the computer to:

use each of said retrieved said setup distributions to parameterize one of said random number generators based at least in part by one said retrieved said setup distributions such that each of said random number generators is parameterized at least in part by one of said retrieved said setup distributions, initialize at least one of said parameterized random number generators to produce an output, generate a fragment performance profile using said outputs, said fragment performance profile including a working value of fragment weight, a working value of fragment velocity, and a fragment working value of ejection angle for each fragment, and store said fragment performance profile in a fragment performance data structure;

providing a plurality of instructions for causing a computer to execute a correlation loop programmed to operate within said fragment loop, said correlation loop iterating until a correlation between a plurality of said working values has been established;

providing a plurality of instructions programmed to execute within said fragment loop for causing a computer to generate end fragments, said computer instructions using as input a polar working value fragment ejection angle, $W_{frag\ ejection\ polar}$, said end fragment generating instructions having computer readable code for causing a computer to generate a first random number D and a second random number X, compare X to D:

when X is greater than D:

generate Theta1 ($\theta_1$) a random value greater than or equal to zero (0) and less than or equal to one hundred and eighty (180), compare Theta1 ($\theta_1$) to $W_{frag\ ejection\ polar}$:

when Theta1 ($\theta_1$) is greater than or equal to $W_{frag\ ejection\ polar}$, generate a random angle Theta2a ($\theta_{2a}$), update and store the value of $W_{frag\ ejection\ polar}$ to be equal to Theta2a ($\theta_{2a}$);

when Theta1 ($\theta_1$) is less than $W_{frag\ ejection\ polar}$, generate a random angle Theta2b ($\theta_{2b}$), update and store the value of $W_{frag\ ejection\ polar}$ to be equal to Theta2b ($\theta_{2b}$);

generate a random number Y, compare Y to a Random Velocity Cutoff:

when Y is greater than the Random Velocity Cutoff: generate a multiplier $m_{1a}$ such that said multiplier is equal to the $\sin(W_{frag\ ejection\ polar})$, multiply said working value of fragment velocity, ($W_{frag\ velocity}$), for the fragment by $m_{1a}$ to generate a first product, and store the first product as said working value fragment velocity, ($W_{frag\ velocity}$), in said fragment performance profile in said fragment performance data structure;

when Y is not greater than the Random Velocity Cutoff:

generate a random number Z, generate a multiplier such that said multiplier ($m_{1b}$) is equal to $Z*\sin(W_{frag\ ejection\ polar})$, multiply said working value of fragment velocity, ($W_{frag\ velocity}$) for the fragment by $m_{1b}$, to generate a second product, store the second product as said working value of fragment velocity, ($W_{frag\ velocity}$), in said fragment performance profile in said fragment performance data structure, wherein all instructions above except said loading instructions and said warhead model instructions form a Monte Carl instruction;

providing at least one instruction for causing the computer to determine whether at least one Monte Carlo instruction remains to be run;

providing at least one instruction for causing the computer to save data from the current Monte Carlo instruction in the computer's memory to distinguish data from different Monte Carlo instruction data, re-seed the random numbers generators, and re-analyze the warhead;

providing a plurality of instructions for causing the computer to process said fragment performance data structure, said processing resulting in a statistically based warhead performance model wherein said statistically based warhead performance model is used to predict a warhead performance.

* * * * *